(12) United States Patent
Kim

(10) Patent No.: US 10,673,020 B2
(45) Date of Patent: Jun. 2, 2020

(54) DISPLAY PANEL AND ELECTRONIC DEVICE INCLUDING THE SAME

(71) Applicant: Samsung Display Co., Ltd., Yongin-Si, Gyeonggi-Do (KR)

(72) Inventor: Namjin Kim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/509,871

(22) Filed: Jul. 12, 2019

(65) Prior Publication Data
US 2020/0106046 A1    Apr. 2, 2020

(30) Foreign Application Priority Data

Sep. 27, 2018 (KR) .................. 10-2018-0114930

(51) Int. Cl.
| | | |
|---|---|---|
| H01L 51/00 | (2006.01) | |
| H01L 27/00 | (2006.01) | |
| H01L 51/52 | (2006.01) | |
| H01L 27/32 | (2006.01) | |

(52) U.S. Cl.
CPC ...... H01L 51/5253 (2013.01); H01L 27/3244 (2013.01); H01L 51/0097 (2013.01); H01L 2227/323 (2013.01)

(58) Field of Classification Search
CPC . H01L 51/5253; H01L 51/0097; H01L 51/56; H01L 51/3262; H01L 51/5256; H01L 27/3244; H01L 27/3276; H01L 27/3225; H01L 27/3246; H01L 27/3262; H01L 27/124; H01L 2227/323
See application file for complete search history.

(56) References Cited

U.S. PATENT DOCUMENTS

| | | | | |
|---|---|---|---|---|
| 5,977,955 | A * | 11/1999 | Jaeger | ................. G02F 1/13306 345/172 |
| 7,633,473 | B2 * | 12/2009 | Uh | ........................ G02F 1/1333 345/103 |
| 9,793,334 | B2 | 10/2017 | Park et al. | |
| 10,079,364 | B2 | 9/2018 | Do et al. | |
| 10,186,191 | B2 | 1/2019 | Kang et al. | |

(Continued)

FOREIGN PATENT DOCUMENTS

| | | |
|---|---|---|
| KR | 1020170059864 A | 5/2017 |
| KR | 1020170065059 A | 6/2017 |

*Primary Examiner* — Nikolay K Yushin
(74) *Attorney, Agent, or Firm* — Cantor Colburn LLP

(57) ABSTRACT

A display panel includes a base substrate including a display area surrounding a hole area, a circuit layer including insulation layers, where an opening is defined through each insulation layer to overlap the hole area, an element layer including an organic light emitting element connected to a transistor, an encapsulation layer disposed on the element layer and including first and second encapsulation inorganic layers and an organic layer, a cover inorganic layer overlapping the hole area and disposed between the first encapsulation inorganic layer and the insulation layers. A module hole is defined through the display panel, and a first groove is defined by portions of the cover inorganic layer and the first and second encapsulation inorganic layers which cover inner surface of the opening and the recess part. The cover inorganic layer contacts the inner surfaces of the opening and the recess part.

22 Claims, 20 Drawing Sheets

(56) References Cited

U.S. PATENT DOCUMENTS

2006/0158588 A1* 7/2006 Uh .................. G02F 1/1333
349/114
2016/0011633 A1* 1/2016 Watanabe ............. G02F 1/1333
345/184
2017/0237038 A1   8/2017 Kim et al.

* cited by examiner

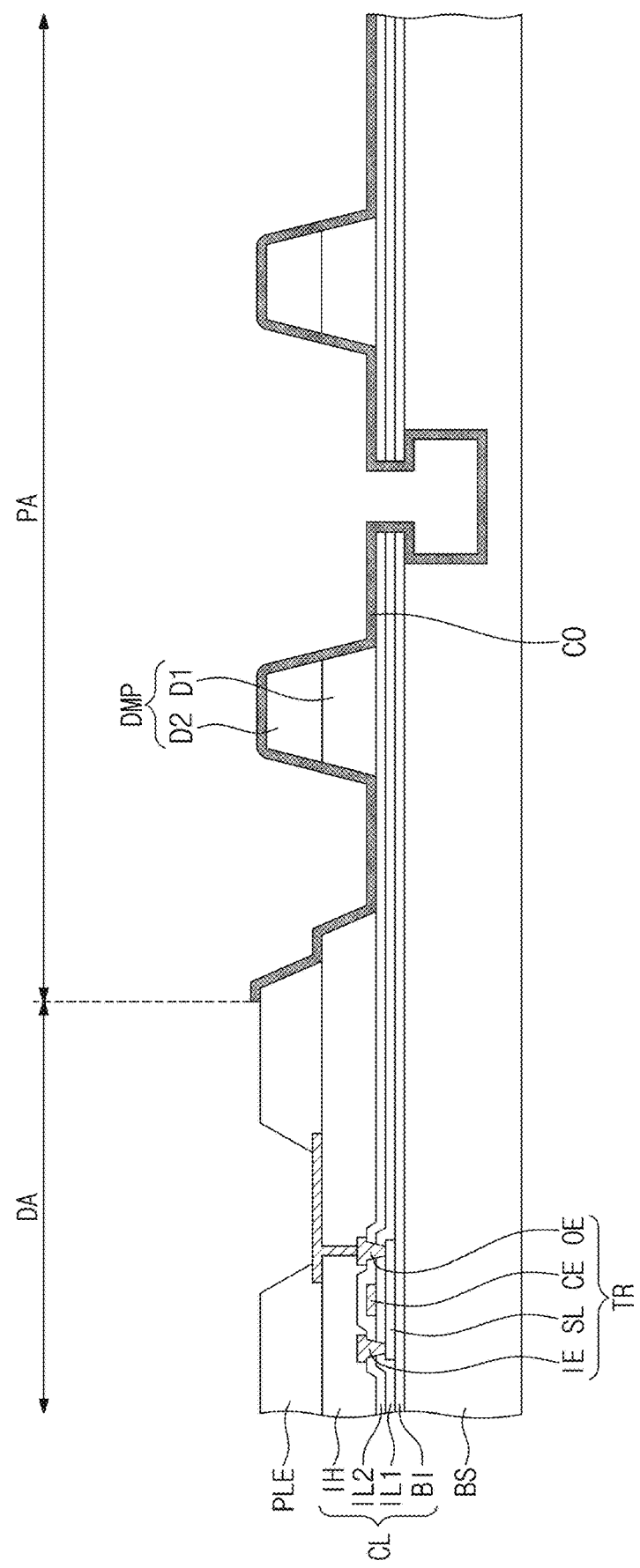

DISPLAY PANEL AND ELECTRONIC DEVICE INCLUDING THE SAME

This application claims priority to Korean Patent Application No. 10-2018-0114930, filed on Sep. 27, 2018, and all the benefits accruing therefrom under 35 U.S.C. § 119, the content of which in its entirety is herein incorporated by reference.

BACKGROUND

1. Field

The disclosure herein relates a display panel and an electronic device including the display panel, and more particularly, to a display panel having improved reliability and an electronic device including the display panel.

2. Description of the Related Art

A display panel may be activated according to an electrical signal to display an image. Such a display panel may be an organic light emitting display panel including an organic light emitting element that has low power consumption, high luminance, and a high response speed.

SUMMARY

An organic light emitting display panel includes an organic light emitting element. The organic light emitting element may be vulnerable to moisture or oxygen and thus easily damaged. Thus, in the organic light emitting display panel, as the moisture or oxygen introduced from an outside are stably blocked, the organic light emitting display device may be improved in reliability and lifetime.

The disclosure provides a display panel, in which impact resistance against an external impact is enhanced, and contamination such as external oxygen and moisture is prevented from being introduced, and a method for manufacturing the display panel, in which a process is simplified.

An embodiment of the invention provides a display panel including: a base substrate divided into a hole area including a recess part in which at least a portion of the base substrate is recessed, a display area surrounding the hole area, and a non-display area adjacent to the display area; a circuit layer disposed on the base substrate and including a transistor overlapping the display area and a plurality of insulation layers, where an opening is defined through each of the insulation layers, and the openings overlap the hole area; an element layer overlapping the display area and including an organic light emitting element connected to the transistor; an encapsulation layer disposed on the element layer and including a first encapsulation inorganic layer, a second encapsulation inorganic layer and an encapsulation organic layer disposed between the first encapsulation inorganic layer and the second encapsulation inorganic layer; a cover inorganic layer overlapping the hole area and disposed between the first encapsulation inorganic layer and an insulation layer of the insulation layers, which is the closest to the first encapsulation inorganic layer. In such an embodiment, a module hole is defined through the base substrate, at least a portion of the insulation layers, the cover inorganic layer, the first encapsulation inorganic layer and the second encapsulation inorganic layer, wherein the module hole overlaps the hole area and is spaced apart from the opening, and a first groove is defined by portions of the cover inorganic layer, the first encapsulation inorganic layer and the second encapsulation inorganic layer which cover an inner surface of the opening of each of the insulation layers and an inner surface of the recess part. In such an embodiment, the cover inorganic layer contacts the inner surface of the opening of each of the insulation layers and the inner surface of the recess part.

In an embodiment, the cover inorganic layer may have a thickness in a range of 500 angstrom (Å) to 20,000 Å.

In an embodiment, the cover inorganic layer may not contact the display area when viewed from a plan view in a thickness direction of the base substrate.

In an embodiment, the cover inorganic layer may include at least one of silicon oxide ($SiO_x$), silicon nitride ($SiN_x$), or silicon oxynitride ($SiO_xN_y$).

In an embodiment, the display panel may further include a dam part overlapping the hole area, where the dam part may include a same material as one of the insulation layers.

In an embodiment, a second groove may be defined by a portion of the base substrate which is recessed from a top surface of the insulation layers, the second groove may be spaced apart from the first groove with the dam part therebetween and the second groove may be covered by the cover inorganic layer and the first encapsulation inorganic layer, the second groove may define an inner space, and the inner space may be filled with the encapsulation organic layer.

In an embodiment, the organic light emitting element may include a first electrode connected to the transistor, a second electrode spaced apart from the first electrode, and an organic layer disposed between the first electrode and the second electrode, and at least one of the organic layer and the second electrode may extend from the display area to the module hole.

In an embodiment, an inner surface of the module hole may be defined by exposed ends passing through the base substrate, at least a portion of the insulation layers, the organic layer, the cover inorganic layer, the first encapsulation inorganic layer, and the second encapsulation inorganic layer.

In an embodiment, the display panel may further include an additional pattern part overlapping the first groove and disposed between the cover inorganic layer and the first encapsulation inorganic layer, where the additional pattern part may include a same material as at least one of the organic layer and the second electrode.

In an embodiment, at least one of the organic layer and the second electrode may cover a side surface defining the opening of each of the insulation layers.

In an embodiment, the additional pattern part may be spaced apart from the organic layer and the second electrode.

In an embodiment, the insulation layers, which overlap the recess part when viewed from a plan view in a thickness direction of the base substrate, of the insulation layers may defined tip parts, and the tip parts may be covered by the cover inorganic layer.

In an embodiment, the first groove may have a closed line shape surrounding the module hole when viewed from a plan view in a thickness direction of the base substrate.

In an embodiment, the recess part may include a bottom part and a side part connected to the bottom part, and the side part may have a curved surface which is irregularly changed in a thickness direction of the base substrate.

In an embodiment, the display panel may further include: an additional base substrate disposed below the base substrate and including an additional recess part overlapping the recess part; and a barrier layer disposed between the base substrate and the additional base substrate, where an additional opening overlapping the additional recess part is defined through the barrier layer. In such an embodiment, the cover inorganic layer may contact an inner surface of each of the openings, the recess part, the additional opening, and the additional recess part.

In an embodiment of the invention, an electronic device includes: a base substrate divided into a hole area including a recess part in which at least a portion of the base substrate is recessed, a display area surrounding the hole area, and a non-display area adjacent to the display area; insulation layers disposed on the base substrate, where an opening is defined through at least a portion of the insulation layers to overlap the hole area; an organic light emitting element overlapping the display area and disposed on the insulation layers; and a plurality of inorganic layers disposed on the insulation layers. In such an embodiment, a module hole is defined through the base substrate, at least portion of the insulation layers and the inorganic layers to overlap the hole area, and a groove is defined by a portion of the inorganic layers which covers an inner surface of the recess part and an inner surface of the opening, where the inorganic, which is the closest to the base substrate, of the inorganic layers contacts the inner surface of the opening and the inner surface of the recess part.

In an embodiment, an inorganic layer, which is closest to the base substrate and contacting the inner surface of the recess part, among the inorganic layers, may not overlap the display area when viewed from a plan view in a thickness direction of the base substrate.

In an embodiment, the electronic device may further include an encapsulation layer which covers the organic light emitting element and includes an encapsulation organic layer and a plurality of encapsulation inorganic layers which seal the encapsulation organic layer, where at least one of the inorganic layers may extend from the encapsulation inorganic layers.

In an embodiment, tip parts may be defined by a portion of the insulation layers overlapping the recess part when viewed from a plan view in a thickness direction of the base substrate, and the tip parts may be covered by the inorganic layer, which contacts the inner surface of the recess part, of the inorganic layers.

In an embodiment, the electronic device may further include an electronic module overlapping the module hole and disposed below the base substrate, wherein the electronic module may include at least one of an audio output module, a light emitting module, a light receiving module and a camera module.

In an embodiment of the invention, a display panel includes: a base substrate divided into a hole area including a recess part in which at least a portion of the base substrate is recessed, a display area surrounding the hole area, and a non-display area adjacent to the display area; a plurality of insulation layers disposed on the base substrate, where an opening is defined through each of the insulation layers, and the opening overlaps the hole area; an organic light emitting element overlapping the display area, disposed on the insulation layers, and including a first electrode, a second electrode spaced apart from the first electrode, and an organic layer disposed between the first electrode and the second electrode; an encapsulation layer disposed on the organic light emitting element and including a first encapsulation inorganic layer, a second encapsulation inorganic layer, and an encapsulation organic layer disposed between the first encapsulation inorganic layer and the second encapsulation inorganic layer; and a cover inorganic layer overlapping the hole area and disposed between the first encapsulation inorganic layer and an insulation layer of the insulation layers, which is closest to the first encapsulation inorganic layer. In such an embodiment, a module hole is defined through the base substrate, at least a portion of the insulation layers, and the cover inorganic layer to overlap the hole area, where the module hole is spaced apart from the opening of each of the insulation layers, a groove is defined by a portion of the cover inorganic layer which covers an inner surface of each of the openings and an inner surface of the recess part, an additional pattern part is disposed between the cover inorganic layer and the first encapsulation inorganic layer to overlap the groove, and the additional pattern part is spaced apart from the organic layer and the second electrode.

In an embodiment, the additional pattern part may include a same material as at least one of the organic layer and the second electrode.

BRIEF DESCRIPTION OF THE FIGURES

These and/or other features of the invention will become apparent and more readily appreciated from the following description of the exemplary embodiments, taken in conjunction with the accompanying drawings, in which:

FIGS. 9A to 9F are cross-sectional views illustrating a method for manufacturing a display panel according to an embodiment of the invention.

DETAILED DESCRIPTION

Figure 1:
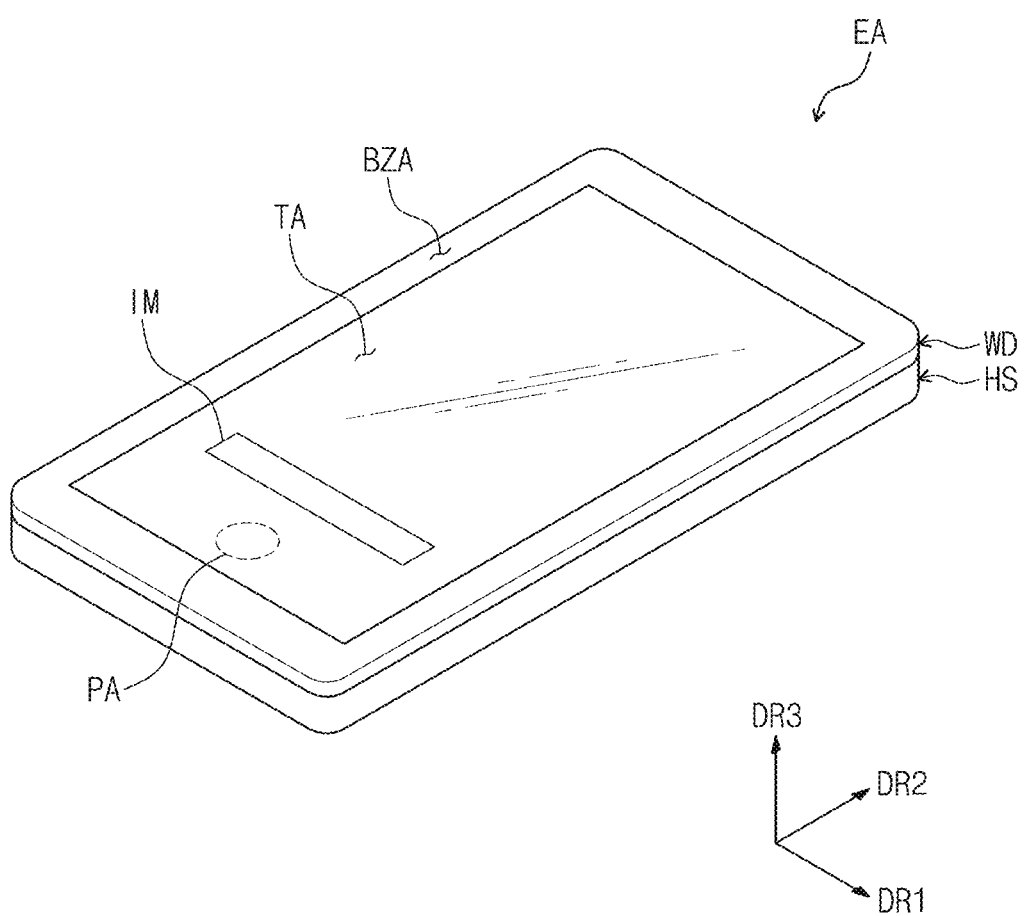
FIG. 1 is a perspective view of an electronic device according to an embodiment of the invention.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

In this specification, it will also be understood that when one component (or region, layer, portion) is referred to as being 'on', 'connected to', or 'coupled to' another component, it can be directly disposed/connected/coupled on/to the one component, or an intervening third component may also be present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." The term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Hereinafter, exemplary embodiments of the invention will be described in detail with reference to the accompanying drawings.

Figure 2:
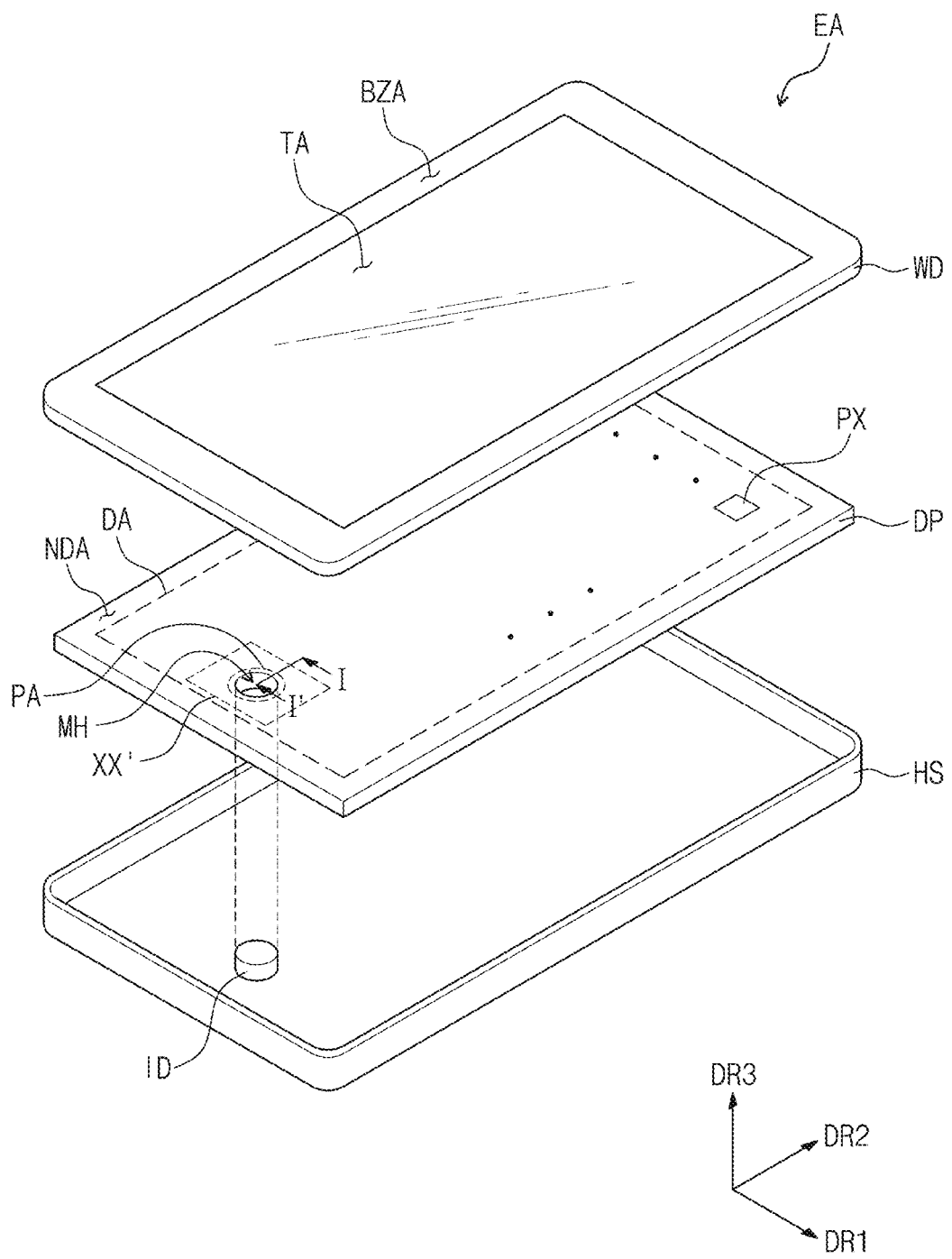
FIG. 2 is an exploded perspective view of the electronic device of FIG. 1.
Figure 3:
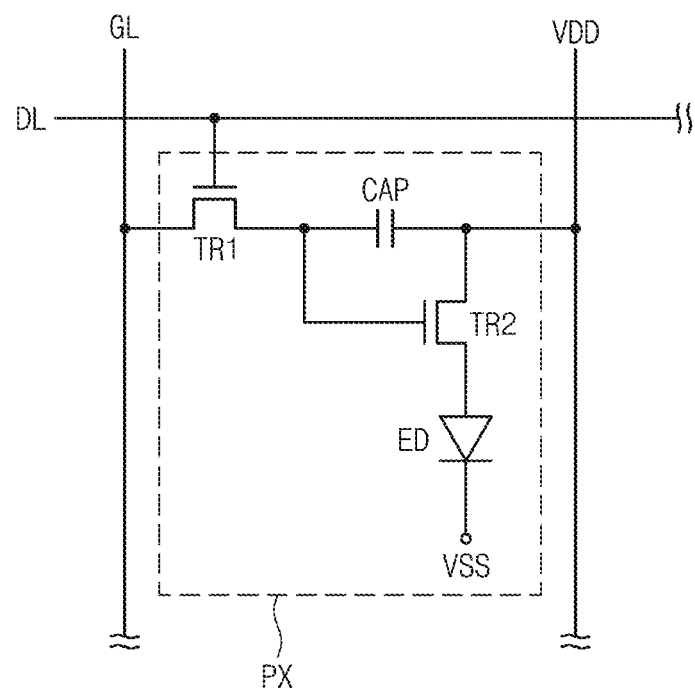
FIG. 3 is an equivalent circuit diagram of a pixel of FIG. 1.
Figure 4:
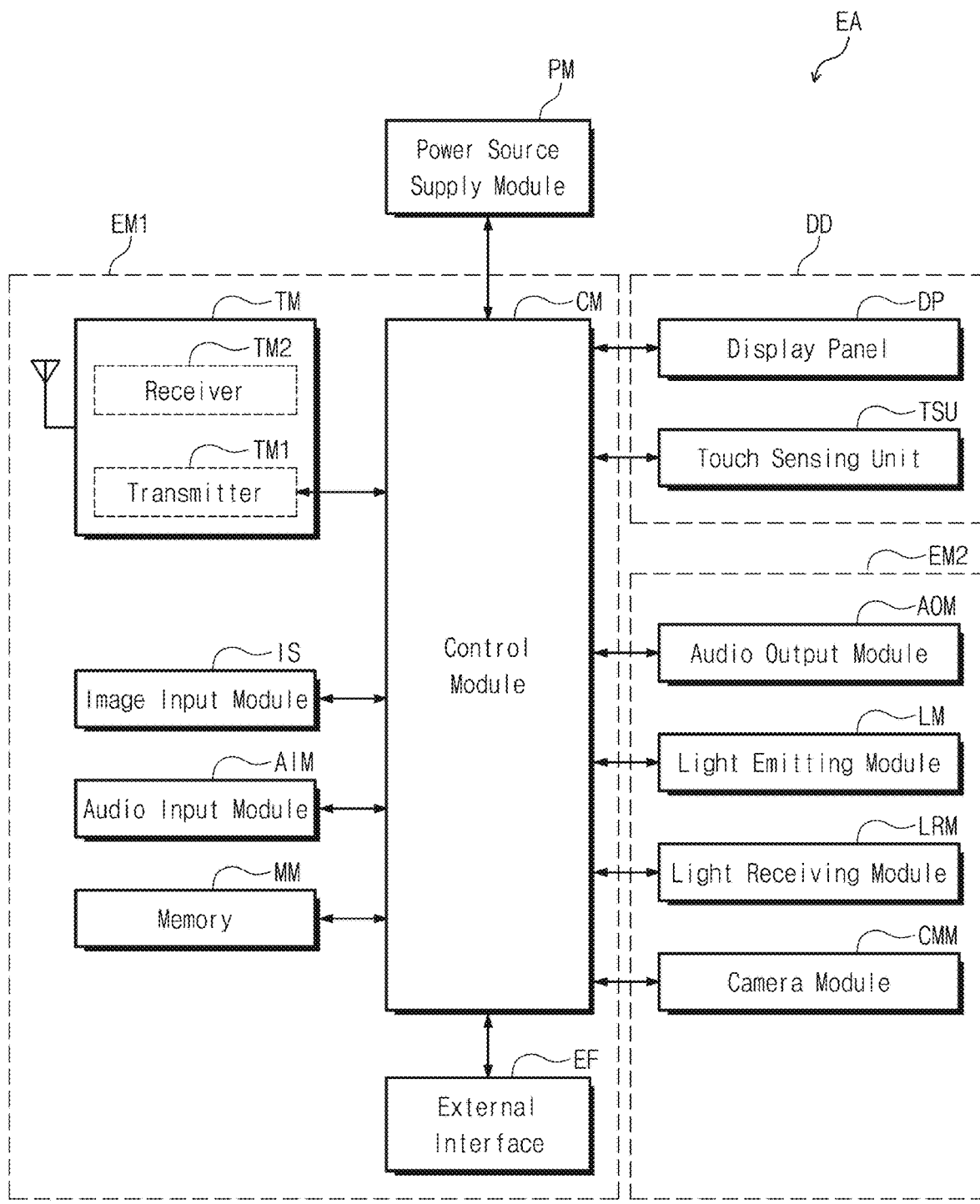
FIG. 4 is a block diagram of the electronic device of FIG. 1.

FIG. 1 is a perspective view of an electronic apparatus according to an embodiment of the invention. FIG. 2 is an exploded perspective view of the electronic device of FIG. 1. FIG. 3 is an equivalent circuit diagram of a pixel of FIG. 1. FIG. 4 is a block diagram of the electronic device of FIG. 1. An embodiment of an electronic device according to the invention will be described with reference to FIGS. 1 to 4.

Referring to FIGS. 1 to 2, an embodiment of an electronic device EA may include a display surface, on which an image IM is displayed, on a front surface thereof. The display surface may be defined in parallel to a surface defined by a first direction DR1 and a second direction DR2. The display surface may include a transmission area TA and a bezel area BZA adjacent to the transmission area TA.

The image IM is displayed on the transmission area TA provided in a window member WD. FIG. 1 illustrates an embodiment where the image IM is an Internet search window. The transmission area TA may have a rectangular shape that is parallel to the first direction DR1 and the second direction DR2. However, this is merely exemplary. In such an embodiment, the shape of the electronic device EA is not limited thereto and may be variously modified.

A normal direction of the display surface may correspond to a thickness direction (hereinafter, referred to as a third direction DR3) of the electronic device EA. In an embodiment, a front surface (or a top surface) or a rear surface (or a bottom surface) of each of the constituents may be defined with respect to a direction in which the image IM is displayed. The front and rear surfaces may face each other in the third direction DR3.

The directions indicated as the first to third direction DR1, DR2, and DR3 may be a relative concept and thus changed into different directions. Hereinafter, the first to third directions may be directions indicated by the first to third direction DR1, DR2, and DR3 shown in the drawings and designated by the same reference numerals, respectively.

An embodiment of the electronic device EA includes a display panel DP, the window member WD, an electronic module ID, and a housing member HS. As illustrated in FIG. 4, the electronic device EA may further include a display module DD, a first electronic module EM1, a second electronic module EM2, and a power supply module PM. In FIG. 2, portions of the constituents of FIG. 4 are omitted.

The display module DD may include a display panel DP and an input sensing unit TSU. The display panel DP displays the image IM. The input sensing unit TSU may sense a user's input applied from an outside. The user's input includes various types of external inputs such as touch by a portion of user's body, light, heat, a pressure, or the like. In FIG. 2, the input sensing unit TSU is omitted for convenience of illustration.

The display panel DP may be divided into a display area DA including a hole area PA and a non-display area NDA. The display area DA may be an area on which the image IM is displayed. A plurality of pixels PX generating the image IM may be disposed in the display area DA. The non-display area NDA is adjacent to the display area DA. The non-display area NDA may surround the display area DA. A driving circuit or a driving line for driving the display area DA may be disposed in the non-display area NDA.

Although not shown, in an embodiment, a portion of the non-display area NDA of the display panel DP may be curved. Thus, one portion of the non-display area NDA may face the front surface of the electronic device EA, and the other portion of the non-display area NDA may face the rear surface of the electronic device EA. In an alternative embodiment of the display panel DP, the non-display area NDA may be omitted. According to an embodiment of the invention, the display area DA may overlap the transmission area TA, and the non-display area NDA may overlap the bezel area BZA.

FIG. 3 illustrates an equivalent circuit diagram of one pixel PX of the pixels PX. Referring to FIG. 3, the pixel PX may be connected to a plurality of signal lines. In FIG. 3, a gate line GL, a data line DL, and a power line VDD of the signal lines are illustrated, but this is merely exemplary. Alternatively, the pixel PX may be further connected to other various signal lines, but is not limited thereto.

The pixel PX may include a first transistor TR1, a capacitor CAP, a second transistor TR2, and an organic light emitting element ED. The first transistor TR1 may be a switching device that controls turn-on/off of the pixel PX. The first transistor TR1 may transmit or block the data signal transmitted through the data line DL in response to the gate signal transmitted through the gate line GL.

The capacitor CAP is connected to the first transistor TR1 and the power line VDD. The capacitor CAP is charged with electrical charges by an amount (e.g., voltage) corresponding to a difference between the data signal received from the first transistor TR1 and a first power voltage applied to the first power line VDD.

The second transistor TR2 is connected to the first transistor TR1, the capacitor CAP and the organic light emitting element ED. The second transistor TR2 controls a driving current flowing through the organic light emitting element ED to correspond to a charge amount stored in the capacitor CAP. A turn-on time or period of the second transistor TR2 may be determined according to the amount of charges charged in the capacitor CAP. The second transistor TR2 provides the first power voltage transmitted through the power line VDD during the turn-on time or period to the organic light emitting element ED.

The organic light emitting element ED is connected to the second transistor TR2 and a power source terminal VSS. The organic light emitting element ED emits a light corresponding to a voltage difference between the signal transmitted through the second transistor TR2 and the second power voltage received through the power source terminal VSS. The organic light emitting element ED may emit light during the turn-on time of the second transistor TR2.

The organic light emitting element ED includes a light emitting material. The organic light emitting element ED may generate light having a color corresponding to the luminescent material thereof. The light generated by the organic light emitting element ED may have one of a red color, a green color, a blue color, and a white color.

The hole area PA may be surrounded by the display area DA. In an embodiment, the hole area PA may be defined within the display area DA. The hole area PA is disposed adjacent to a module hole MH. In an embodiment, the hole area PA may surround the module hole MH. In such an embodiment, the hole area PA may be defined in one side as illustrated in FIG. 2, the embodiment of the invention is not limited thereto. Alternatively, the position of the hole area PA may be variously modified based on the position of the module hole MH.

The module hole MH overlaps the hole area PA when viewed from a plan view in the third direction DR3. The module hole MH overlaps the electronic module ID on a plane. The electronic module ID may be inserted into the module hole MH. In such an embodiment, the electronic module ID may be disposed on the rear surface of the display panel DP adjacent to the module hole MH, and only one constituent of the electronic module ID may be exposed to the outside through the module hole MH. In one embodiment, for example, only a lens provided in the camera module CMM may be exposed to the outside through the module hole MH. Alternatively, the electronic module ID may be disposed on the rear surface of the display panel DP and be spaced apart from the display panel DP on a cross-section.

An embodiment of the display panel DP according to the invention may include the module hole MH defined in the display area DA and thus may not provide a separate space for the electronic module ID to the outside of the display area DA. Thus, the non-display area may be reduced in a surface area to realize the electronic device EA having a narrow bezel. In such an embodiment, the electronic module ID is accommodated in the module hole MH, such that a compact electronic device EA may be realized.

The window member WD is disposed on the front surface of the electronic device EA. The window member WD may be disposed on the front surface of the display panel DP to protect the display panel DP. In one embodiment, for example, the window member WD may include a glass substrate, a sapphire substrate, or a plastic film. The window member WD may have a single layer or multilayered structure. In one embodiment, for example, the window member WD may have a laminated structure of a plurality of plastic films bonded to each other by an adhesive or a laminated structure of a glass substrate and a plastic film, which are bonded to each other by an adhesive.

The window member WD may include a transparent material to provide the transmission area TA and the bezel area BZA of the electronic device EA. According to an embodiment, the transmission area TA may correspond to the display area DA. In one embodiment, for example, the transmission area TA overlaps an entire surface of at least a portion of the display area DA. The image IM displayed on the display area DA of the display panel DP may be visible through the transmission area TA from the outside.

The housing member HS may be coupled to the window member WD. The housing member HS may be provided on the rear surface of the electronic device EA. The housing member HS be coupled to the window member WD to define an inner space. The display panel DP, the electronic module ID, and various constituents of FIG. 4 may be accommodated in the inner space. The housing member HS may include a material having relatively high rigidity. In one embodiment, for example, the housing member HS may include a plurality of frames and/or plates, which include or are made of glass, plastic or a metal. The housing member HS may stably protect the constituents of the electronic device EA, which are accommodated in the inner space, from an external impact.

Referring to FIG. 4, the power supply module PM supplies power to be used for an overall operation of the electronic device EA. The power supply module PM may include a general battery module.

The electronic module ID includes various functional modules for driving the electronic device EA. The electronic module ID may include a first electronic module EM1 and a second electronic module EM2.

The first electronic module EM1 may be directly mounted on a mother board electrically connected to the display module DD or may be mounted on a separate board and electrically connected to the mother board through a connector (not shown).

The first electronic module EM1 may include a control module CM, a wireless communication module TM, an image input module IS, an audio input module AIM, a memory MM, and an external interface EF. A portion of the modules may not be mounted on the mother board but electrically connected to the mother board through a flexible circuit board.

The control module CM controls the overall operation of the electronic device EA. The control module CM may be a microprocessor. In one embodiment, for example, the control module CM may activate or inactivate the display module DD. The control module CM may control other modules such as the image input module IS or the audio input module AIM on the basis of a touch signal received from the display module DD.

The wireless communication module TM may transmit/receive a wireless signal to/from the other terminal by using Bluetooth® or Wi-Fi line. The wireless communication module TM may transmit/receive an audio signal by using a general communication line. The wireless communication module TM includes a transmitter TM1 for modulating and transmitting a signal to be transmitted and a receiver TM2 for demodulating the received signal.

The image input module IS processes the image signal to convert the processed image signal into image data that is capable of being displayed on the display module DD.

The audio input module AIM receives external audio signals by using a microphone during recording mode or a voice recognition mode to convert the received audio signal into electrical sound data.

Data recessed from the image wireless communication module TM, the image input module IS, and the audio input module AIM may be stored in the memory MM to be used, and the used data may be deleted from the memory MM. In addition, data to be used for controlling the second electronic module EM2 may be stored in or deleted from the memory MM.

The external interface EF serves as an interface connected to an external charger, a wired/wireless data port, and a card socket, for example, a memory card and a subscriber identity module ("SIM")/user identity module ("UIM") card.

The second electronic module EM2 may include an audio output module AOM, a light emitting module LM, a light receiving module LRM, and a camera module CMM. The above-described constituents may be directly mounted on the mother board, may be mounted on a separate board and electrically connected to the display module DD through a connector, or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. The light emitting module LM may include an LED. The light receiving module LRM may sense the infrared rays. The light receiving module LRM may be activated when infrared rays having a predetermined level (or intensity) or higher is sensed. The light receiving module LRM may include a complementary metal oxide semiconductor ("CMOS") sensor. The infrared rays generated in the light emitting module LM may be outputted and then be reflected by an external object (for example, a user's finger or face), and the reflected infrared rays may be incident into the light receiving module LRM. The camera module CMM photographs a subject.

The electronic module ID of FIG. 2 may be at least one of the constituents of the second electronic module EM2. Here, the remaining constituents of the constituents of the first electronic module EM1 and the second electronic module EM2 may be disposed at different positions and thus may not be illustrated. In one embodiment, for example, the electronic module ID may include at least one of an audio output module AOM, a light emitting module LM, a light receiving module LRM and a camera module CMM.

Figure 5A:
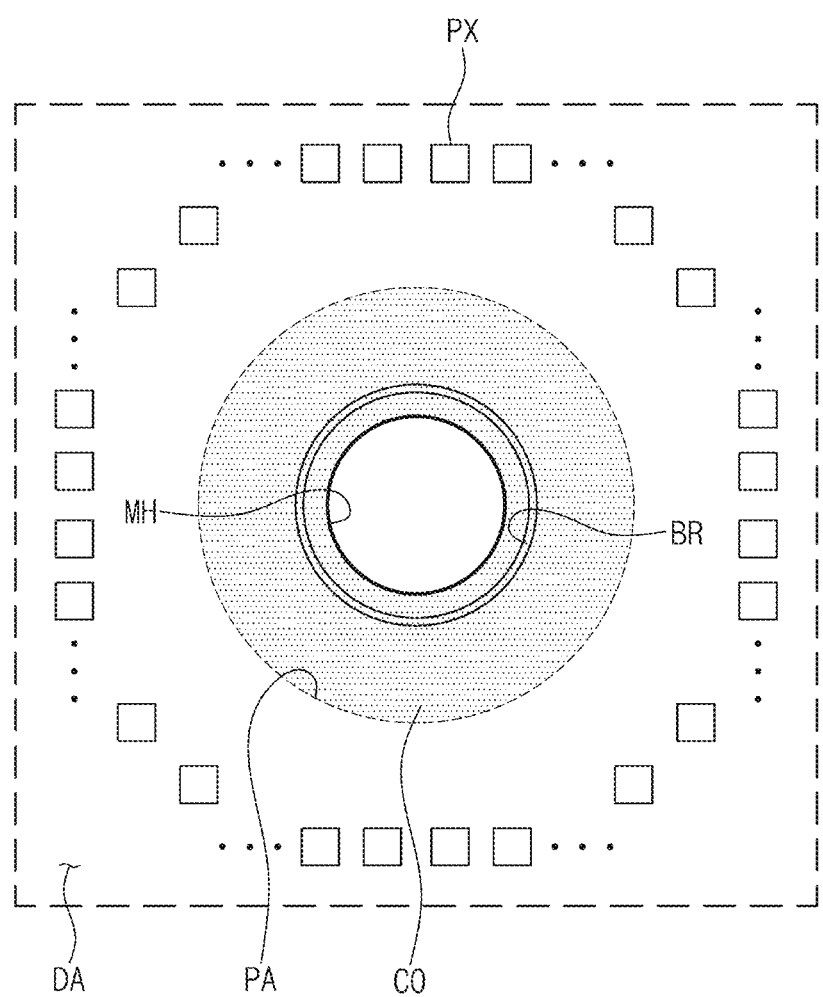
FIG. 5A is an enlarged view of an area XX' of FIG. 2.
Figure 5B:
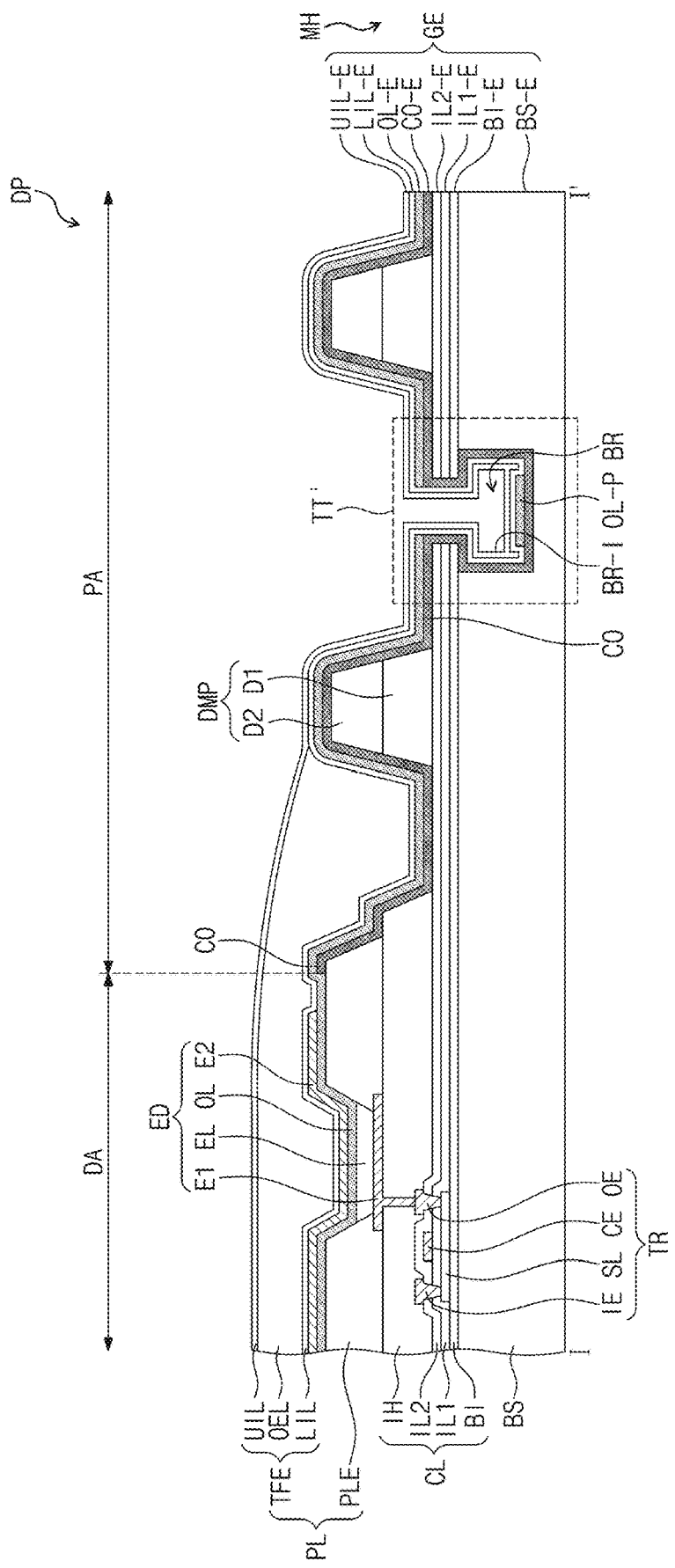
FIG. 5B is a cross-sectional view illustrating one area of a display panel, taken along ling I-I' of FIG. 2.
Figure 5C:
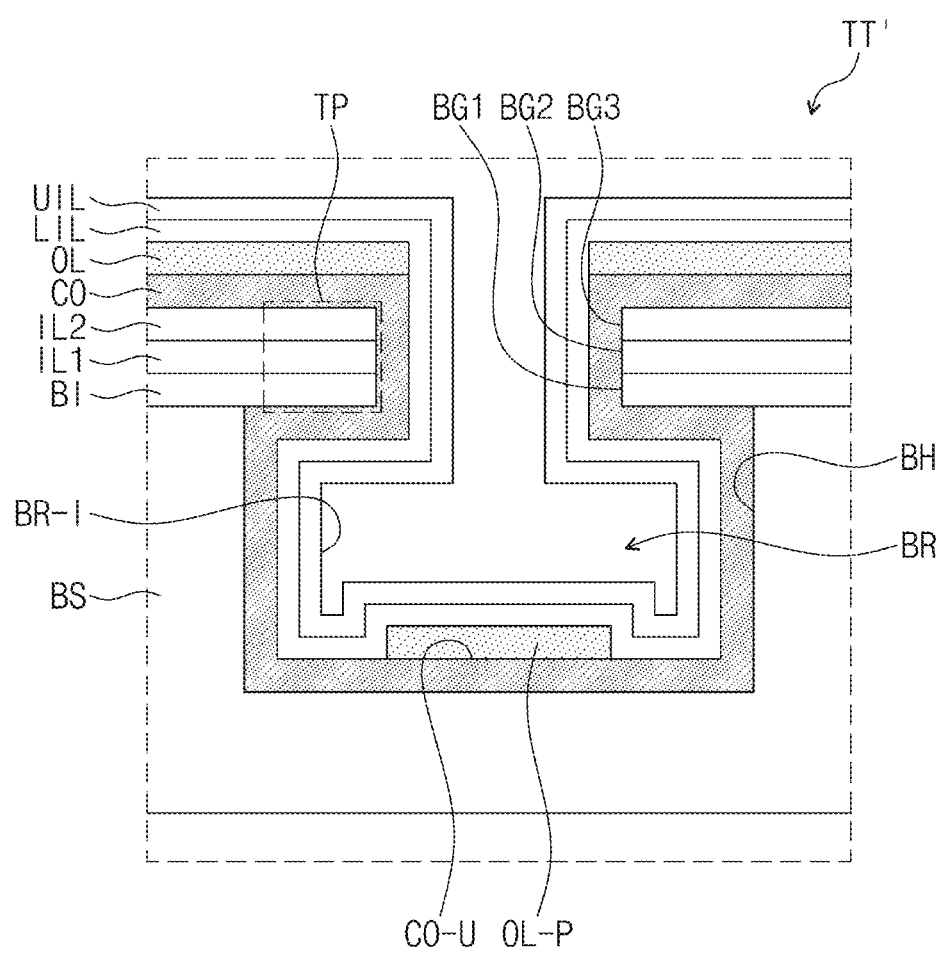
FIG. 5C is an enlarged view illustrating an area TT' of FIG. 5B.

FIG. 5A is an enlarged view of an area XX' of FIG. 2. FIG. 5B is a cross-sectional view illustrating one area of the display panel, taken along ling I-I' of FIG. 2. FIG. 5C is an enlarged view illustrating an area TT' of FIG. 5B.

Referring to FIGS. 5A and 5B, the hole area PA may be defined within the display area DA. The hole area PA may be surrounded by the display area DA within the display area DA. The hole area PA may be an area including a module hole MH and a groove BR. The hole area PA according to an embodiment of the invention may have a circular shape surrounding the groove BR.

The groove BR overlaps the hole area PA when viewed from a plan view in the third direction DR3. The groove BR may be disposed within the hole area PA. In an embodiment, the groove BR may have a circular shape surrounding the module hole MH. The groove BR may have a closed line shape that is disposed between the module hole MH and the hole area PA to surround the module hole MH.

The module hole MH overlaps the hole area PA when viewed from a plan view in the third direction DR3. The module hole MH may be disposed within the hole area PA and surrounded by the groove BR. In one embodiment, for example, the module hole MH may have a circular shape. However, the embodiment of the invention is not limited thereto. In an alternative embodiment, the hole area PA, the groove BR, and the module hole MH may have at least one of various shapes and also have different shapes from each other.

The display panel DP includes a base substrate BS, a circuit layer CL, and an element layer PL. The circuit layer CL is disposed on the base substrate B, and the element layer PL is disposed on the circuit layer CL.

The base substrate BS includes a glass substrate, a metal substrate, or a flexible plastic substrate. However, the embodiment of the invention is not limited thereto. In one embodiment, for example, the base substrate BS may be a substrate including the base layer containing an organic material.

In one embodiment, for example, the organic material of the base substrate BS may include at least one of polyimide, polyethylene naphthalate, polyethylene terephthalate, polyarylate, polycarbonate, polyetherimide, and polyethersulfone. In such an embodiment, the base substrate BS may be rigid or flexible, but not being limited thereto.

The circuit layer CL may include a transistor TR, a plurality of insulation layers BI, IL1, IL2, and IH and a cover inorganic layer CO. The circuit layer CL is disposed on the base substrate BS.

The barrier layer BI is disposed on the base substrate BS. The barrier layer BI may cover the base substrate BS. The barrier layer BI may be an insulation layer including an inorganic material. In one embodiment, for example, the barrier layer BI may include at least one of aluminum oxide (AlO$_x$), titanium oxide (TiO$_x$), silicon oxide (SiO$_x$), silicon oxynitride (SiO$_x$N$_y$), zirconium oxide (ZrO$_x$), or hafnium oxide (HfO$_x$). The barrier layer BI may be provided as a multilayered inorganic layer. The barrier layer BI may effectively prevent foreign substances from being introduced from an outside.

Although not shown, an embodiment of the display panel may further include a buffer layer (not shown). The buffer layer may be disposed on the barrier layer BI. The buffer layer may include an inorganic material or an organic material. The buffer layer may have adhesion greater than that of the barrier layer BI with respect to a semiconductor pattern SL, which will be described later, or the first insulation layer IL1. Thus, the circuit layer CL may be stably disposed on the base substrate BS.

The transistor TR includes a semiconductor pattern SL, a control electrode CE, an input electrode IE, and an output electrode OE. The transistor TR controls movement of charges in the semiconductor pattern SL through the control electrode CE to output an electrical signal inputted from the input electrode IE through the output electrode OE. FIG. 5B illustrates a transistor TR, which corresponds to a driving transistor, of the transistors TR1 and TR2 of FIG. 3.

The semiconductor pattern SL is disposed on the base substrate BS. The semiconductor pattern SL may include a crystalline semiconductor material, a metal oxide semiconductor material, polycrystalline silicon, or amorphous silicon. In an embodiment, the control electrode CE may be disposed on the semiconductor pattern SL in the transistor TR, but the embodiment of the invention is not limited thereto. In one alternative embodiment, for example, the transistor TR may have a bottom-gate structure in which the control electrode CE is disposed on the base substrate BS and covered by the first insulation layer IL1, and the semiconductor pattern SL is disposed on the first insulation layer IL1, but is not limited thereto.

The first insulation layer IL1 may be disposed between the semiconductor pattern SL and the control electrode CE. The first insulation layer IL1 covers the base substrate BS and the semiconductor pattern SL. The first insulation layer IL1 includes an inorganic material, but is not limited thereto.

The control electrode CE is disposed on the semiconductor pattern SL. The control electrode CE is spaced apart from the semiconductor pattern SL with the first insulation layer IL1 therebetween. The control electrode CE may overlap the semiconductor pattern SL when viewed from a plan view in the third direction DR3.

The second insulation layer IL2 may be disposed between the control electrode CE and the input electrode IE and between the control electrode CE and the output electrode OE. The second insulation layer IL2 covers the first insulation layer IL1 and the control electrode CE. The second insulation layer IL2 includes an inorganic material, but is not limited thereto.

The input electrode IE and the output electrode OE are disposed on the second insulation layer IL2. The input electrode IE and the output electrode OE are connected to the semiconductor pattern SL through the first insulation layer IL1 and the second insulation layer IL2, respectively, for example. Alternatively, the input electrode IE and the output electrode OE may be directly connected to the semiconductor pattern SL.

The third insulation layer IH is disposed on the second insulation layer IL2. The third insulation layer IH may cover the transistor TR. The third insulation layer IH may be disposed between the transistor TR and the element layer PL to electrically insulate the transistor TR from the element layer PL.

The element layer PL includes a pixel defining layer PLE, an organic light emitting element ED, and an encapsulation layer TFE. The pixel defining layer PLE is disposed on the third insulation layer IH. A plurality of openings may be defined in the pixel defining layer PLE. The organic light emitting element ED may be disposed in each of the openings.

The organic light emitting element ED includes a first electrode E1, a second electrode E2, a light emitting layer EL, and a charge control layer OL. According to an embodiment of the invention, the light emitting layer EL and the charge control layer OL may be defined as organic layers.

The organic light emitting element ED overlaps the display area DA. The first electrode E1 is disposed on the third insulation layer IH. The first electrode E1 may be electrically connected to the transistor TR by a hole defined through the third insulation layer IH. The first electrode E1 may be provided in plural. At least a portion of the plurality of first electrodes E1 may be exposed by a corresponding opening of the pixel defining layer PLE.

The second electrode E2 is disposed on the first electrode E1. The second electrode E2 may be disposed to cover only a portion of the pixel defining layer PLE. However, the embodiment of the invention is not limited thereto. Alternatively, the second electrode E2 may extend up to the hole area PA to cover the hole area PA.

In one embodiment, for example, the second electrodes E2 of the plurality of organic light emitting elements ED may be connected to each other or integrally formed with each other as single unitary body. Thus, the plurality of organic light emitting elements ED may receive a same voltage through the common second electrode E2. Thus, in such an embodiment, a separate patterning process for forming the second electrode E2 may be omitted. However, this is merely exemplary. Alternatively, the second electrode E2 may be provided in plural to correspond to the openings.

The second electrode E2 may include optically transparent transmissive electrode. In one embodiment, for example, the second electrode E2 may include at least one of indium zinc oxide ("IZO"), indium tin oxide ("ITO"), indium gallium oxide ("IGO"), indium zinc gallium oxide ("IGZO"), and a mixture/compound thereof. Thus, the display panel DP displays an image on the front surface thereof. However, this is merely exemplary. Alternatively, the second electrode E2 may be a reflective electrode or a transflective electrode according to a direction in which the image is displayed.

According to an embodiment of the invention, the organic layer may be defined to include the light emitting layer EL and the charge control layer OL. The light emitting layer EL is disposed between the first electrode E1 and the second electrode E2. The light emitting layer EL may be provided in plural, and the plurality of light emitting layers EL may be respectively disposed on the openings. The organic light emitting element ED may activate the light emitting layer EL based on a potential difference between the first electrode E1 and the second electrode E2 to generate light.

The charge control layer OL is disposed between the first electrode E1 and the second electrode E2. The charge control layer OL is disposed adjacent to the light emitting layer EL. In an embodiment, the charge control layer OL is disposed between the light emitting layer EL and the second electrode E2. However, this is merely exemplary. Alternatively, the charge control layer OL may be disposed between the light emitting layer EL and the first electrode E1 and may be provided as a plurality of layers that are laminated in the third direction DR3 with the light emitting layer EL therebetween.

The charge control layer OL may be integrally formed as a single unitary body to overlap the front surface of the base substrate BS without a separate patterning process.

In an embodiment, the charge control layer OL may be disposed on area other than the openings defined in the pixel defining layer PLE. The charge control layer OL may control movement of electrons to improve light emitting efficiency. The charge control layer OL may include an electron transport layer and an electron injection layer.

The encapsulation layer TFE is disposed on the organic light emitting element ED. In an embodiment, as shown in FIG. 5B, the encapsulation layer TFE may include a first encapsulation inorganic layer LIL, an encapsulation organic layer OEL, and a second encapsulation inorganic layer UIL.

The first encapsulation inorganic layer LIL is disposed on the organic light emitting element ED. The first encapsulation inorganic layer LIL may be disposed on the charge control layer OL disposed on the front surface of the base substrate BS to contact the charge control layer OL. The second encapsulation inorganic layer UIL is disposed on the first encapsulation inorganic layer LIL. The first encapsulation inorganic layer LIL and the second encapsulation inorganic layer UIL may seal an encapsulation organic layer OEL. Each of the first encapsulation inorganic layer LIL and the second encapsulation inorganic layer UIL may include an inorganic material. In one embodiment, for example, each of the first encapsulation inorganic layer LIL and the second encapsulation inorganic layer UIL may include at least one of aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), and zinc oxide ($ZnO_x$).

The encapsulation organic layer OEL may be disposed between the first encapsulation inorganic layer LIL and the second encapsulation inorganic layer UIL. The encapsulation organic layer OEL may include an organic material. In one embodiment, for example, the encapsulation layer OEL may include at least one of epoxy, polyimide, polyethylene terephthalate, polycarbonate, polyethylene, and polyacrylate.

The first encapsulation inorganic layer LIL and the second encapsulation inorganic layer UIL may be integrated or attached to each other to be disposed on the front surface of the display panel DP when viewed from a plan view in the third direction DR3. Each of the first encapsulation inorganic layer LIL and the second encapsulation inorganic layer UIL may partially overlap the encapsulation organic layer OEL. Thus, the first encapsulation inorganic layer LIL and the second encapsulation inorganic layer UIL may be spaced apart from each other in the third direction DR3 with the encapsulation organic layer OEL therebetween on one portion of the area and directly contact each other in the third direction on the other portion of the area. The encapsulation layer TFE may seal the organic light emitting element ED to protect the organic light emitting element ED against foreign substances which may be introduced thereinto from the outside.

The display panel DP may further include a dam part DMP. The dam part DMP may overlap the hole area PA. The dam part DMP may extend along an edge adjacent to the hole area PA at a boundary between the display area DA and the hole area PA. The dam part DMP may be surrounded by the display area DA or be disposed at at least one side of the display area, for example, at a side adjacent to a pad (not shown) or a driving circuit (not shown).

The dam part DMP includes a first dam part D1 and a second dam part D2. The dam part DMP may be disposed on the second insulation layer IL2. In an embodiment, the first dam part D1 may include a same material as the third insulation layer IH. The second dam part D2 may include a same material as the pixel defining layer PLE. The dam part DMP may include a plurality of layer, but is not limited thereto. Alternative, the dam part DMP may have a single layer structure including a same material as at least one of the third insulation layer IH and the pixel defining layer PLE.

The dam part DMP may be defined as an area into which a liquid organic material is spread in a process of forming the encapsulation organic layer OEL. The encapsulation organic layer OEL may be manufactured in an inkjet manner in which the liquid organic material is applied to the first encapsulation inorganic layer LIL. Here, the dam part DMP may set a boundary of an area to which the liquid organic material applied and effectively prevent the liquid organic material from overflowing to an outside of the boundary.

The module hole MH overlaps the hole area PA. The module hole MH is disposed on the hole area PA. The module hole MH may be defined through the base substrate BS. In one embodiment, for example, the module hole MH may be defined or formed through the base substrate BS, the barrier layer BI, the first insulation layer IL1, the second insulation layer IL2, the cover inorganic layer CO, the charge control layer OL, the first encapsulation inorganic layer LIL and the second encapsulation inorganic layer UIL. Although not shown, in an embodiment where the second electrode E2 extends up to the hole area PA, the module hole MH may be defined through the second electrode E2.

The module hole MH may be defined as ends of penetrated constituent of the constituents of the display panel DP. The module hole MH may have an inner surface GE defined by an end BS-E of the base substrate, an end BI-E of the barrier layer BI-E, an end of the first insulation layer IL1-E, an end of the second insulation layer IL2-E, an end of the charge control layer OL-E, an end of the cover inorganic layer CO-E, an end of the first encapsulation inorganic layer LIL-E, and an end of the second encapsulation inorganic layer UIL-E.

The end of the base substrate BS-E, the end of the barrier layer BI-E, the end of the first insulation layer IL1-E, the end of the second insulation layer IL2-E, the end of the charge control layer OL-E, the end of the cover inorganic layer CO-E, the end of the first encapsulation inorganic layer LIL-E, and the end of the second encapsulation inorganic layer UIL-E define an inner surface GE of the module hole MH, which define the inner surface GE, may be aligned with each other.

The groove BR overlaps the hole area PA. The groove BR may be provided by recessing a portion of the base substrate BS from the top surface of the barrier layer BI and be covered by at least one of the cover inorganic layer CO, the first encapsulation inorganic layer LIL and the second encapsulation inorganic layer UIL. According to an embodiment of the invention, the groove BR is disposed around the module hole MH to block a moving path of the moisture and oxygen, which are introduced from the module hole MH. Thus, the display panel DP having improved reliability may be provided.

In an embodiment, the cover inorganic layer CO may overlap the hole area PA. The cover inorganic layer CO may be disposed to be spaced apart from the organic light emitting element ED when viewed from a plan view in the third direction DR3. Thus, the cover inorganic layer CO may not overlap the display area DA.

The cover inorganic layer CO may overlap the groove BR and may be one of the ends defining the inner surface GE of the module hole MH. In FIG. 5A, for convenience of illustration, an area on which the cover inorganic layer CO is disposed is shaded.

Referring to FIG. 5C, the base substrate BS may overlap the hole area PA and includes a recess part BH in which at least a portion of the base substrate BS is recessed. A first opening BG1, which overlaps the hole area PA, is defined through the barrier layer BI, a second opening, which overlaps the hole area PA, is defined through the first insulation layer IL1, and a third opening BG3, which overlaps the hole area PA, is defined through the third insulation layer IH. The recess part BH, the first opening BG1, the second opening BG2, and the third opening BG3 overlap each other when viewed from a plan view in the third direction DR3.

At least one of the cover inorganic layer CO, the first encapsulation inorganic layer LIL and the second encapsulation inorganic layer UIL may cover an inner surface of each of the first opening BG1, the second opening BG2, and the third opening BG3 to define the groove BR.

According to an embodiment, the groove BR may include an inner space BR-I. The inner space BR-I may be an area that is defined by allowing the cover inorganic layer CO, the first encapsulation inorganic layer LIL, and the second encapsulation inorganic layer UIL to cover the inner surface of each of the first opening BG1, the second opening BG2 and the third opening BG3. The inner space BR-I may be provided in an under-cut shape that is formed during etching of the base substrate BS and the insulation layers BI, IL1, and IL2. The inner space BR-I of the groove BR may be provided by covering the under-cut shape of the inner surfaces, which are exposed by etching the base substrate BS and the insulation layers BI, IL1, and IL2, through at least one of the cover inorganic layer CO, the first encapsulation inorganic layer LIL and the second encapsulation inorganic layer UIL.

The cover inorganic layer CO may contact the inner surface of each of the recess part BH, the first opening BG1, the second opening BG2, and the third opening BG3. The first encapsulation inorganic layer LIL is disposed on the cover inorganic layer CO, and the second encapsulation inorganic layer UIL is disposed on the first encapsulation inorganic layer LIL. The first encapsulation inorganic layer LIL and the second encapsulation inorganic layer UIL may contact each other on the hole area PA.

The cover inorganic layer CO may have a thickness in a range of about 500 angstrom (Å) to about 20,000 Å. If the cover inorganic layer CO is less than a thickness of about 500 Å, the cover inorganic layer CO contacting the tip part TP may be weakened in durability, and thus, it a rigid tip part TP may not be stably provided. If the cover inorganic layer CO exceeds a thickness of about 20,000 Å, each of the openings of the insulation layers BI, IL1, and IL2 covered by the cover inorganic layer CO may increase in width, and thus, the groove BR may be visible through a naked eye.

The cover inorganic layer CO may include an inorganic material. In one embodiment, for example, the cover inorganic layer CO may include at least one of silicon oxide ($SiO_x$), silicon nitride ($SiN_x$), and silicon oxynitride ($SiO_xN_y$).

According to an embodiment, portions of the barrier layer BI, the first insulation layer IL1 and the second insulation layer IL2, which overlap the groove BR and cover a portion of the base substrate BS, may collectively define the tip part TP when viewed from a plan view in the third direction DR3. According to an embodiment, the tip part TP may include a portion of each of the barrier layer BI, the first insulation layer IL1, and the second insulation layer IL2. However, the embodiment of the invention is not limited thereto. Alternatively, at least one of the barrier layer BI, the first insulation layer IL1 and the second insulation layer IL2, which constitute the tip part TP, may be omitted.

The tip part TP may be a portion of the under-cut shape. When the tip part TP is provided as a plurality of insulation layers, the insulation layers constituting the tip part TP may be delaminated and cracked by an external impact. When the delamination and/or crack of the insulation layers of the tip part TP occur, the moisture and oxygen introduced from the outside may be permeated into the circuit layer CL and the element layer PL to deteriorate reliability of the display panel DP.

According to an embodiment of the invention, the separate cover inorganic layer CO covering the tip part TP may be provided to stably provide the rigid tip part TP. Thus, the display panel DP having the improve impact resistance may be provided.

According to an embodiment of the invention, the display panel DP include an additional pattern part OL-P. The additional pattern part OL-P may be disposed on a top surface CO-U of the cover inorganic layer overlapping an inner bottom surface of the groove BR. The additional pattern part OL-P may cover at least a portion of the top surface CO-U of a portion of the cover inorganic layer CO on the inner bottom surface of the groove BR. The additional part OL-P may be formed while organic layers EL and OL of the organic light emitting element and/or the second electrode E2 are deposited after the groove formation process. For convenience of description, although the additional pattern part OL-P is described as the separation additional constitution, the additional pattern part OL-P may be a pattern including substantially a same material as the organic layers EL and OL and/or the second electrode E2.

The additional pattern part OL-P may be disconnected from the organic layers EL and OL and/or the second electrode E2. An area on which the deposition material for forming the organic layers EL and OL and/or the second electrode E2 is not applied may be generated within the groove BR. Thus, the additional pattern part OL-P may be disconnected from the charge control layer OL. The additional pattern part OL-P may be disconnected from the charge control layer OL to block the path of the moisture and oxygen introduced from the module hole MH. Thus, the display panel DP having the improved reliability may be provided.

Figure 6:
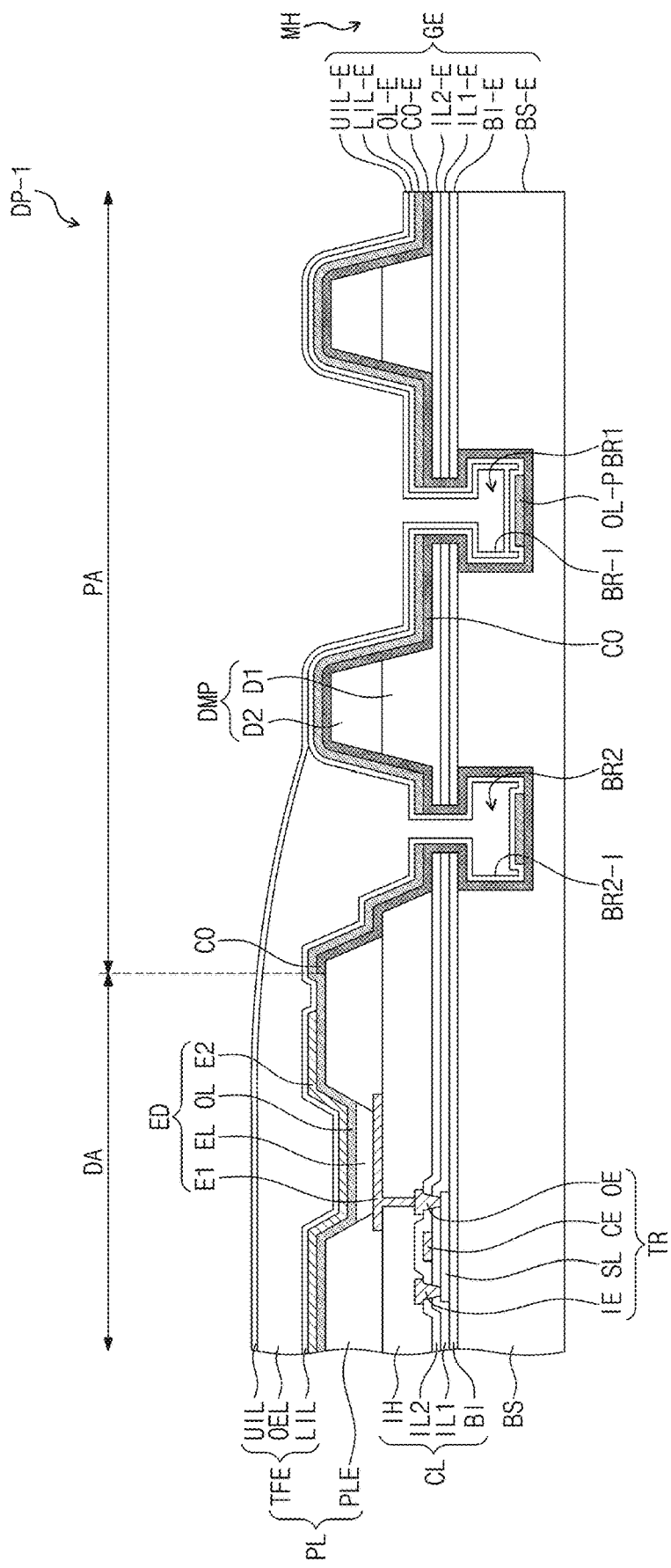
FIG. 6 is a cross-sectional view illustrating an area of a display panel according to an embodiment of the invention.

FIG. 6 is a cross-sectional view illustrating an area of the display panel according to an embodiment of the invention. The same reference numerals are used to indicate the same components as that of FIGS. 1 to 5C, and any repetitive detailed descriptions will be omitted.

Referring to FIG. 6, an embodiment of the display panel DP-1 may include a first groove BR1 and a second groove BR2. The first groove BR1 may be disposed between the hole area PA and the module hole MH. The second groove BR2 may be disposed to be spaced apart from the first groove BR1 with the dam part DMP therebetween. The first groove BR1 may correspond to the groove BR of FIG. 5B.

In such an embodiment, the second groove BR2 may be defined by recessing a portion of the base substrate BS from a top surface of the second insulation layer IL2 and be covered by the cover inorganic layer CO and the first encapsulation inorganic layer LIL. An additional pattern part OL-P may be disposed between the cover inorganic layer CO overlapping the second groove BR2 and the first encapsulation inorganic layer LIL.

The second groove BR2 includes an inner space BR2-I. The inner space BR2-I may be an area that is defined by portions of the cover inorganic layer CO and the first encapsulation inorganic layer LIL that cover the recessed inner surface of the base substrate BS and the inner surfaces a hole defined through the insulation layers BI, IL1, and IL2. The inner space BR2-I may be provided in the under-cut shape.

In such an embodiment, the inner space BR2-I of the second groove BR2 may be filled with an organic material. In one embodiment, for example, the inner space BR2-I may be filled with the encapsulation organic layer OEL of the encapsulation layer TFE. In such an embodiment, the inner space BR2-I of the second groove BR2 may be filled with the encapsulation organic layer OEL such that the rigid tip part TP is provided. Thus, the display panel DP-1 having the improved reliability may be provided.

Although not shown, in an embodiment, the groove may be provided in plural. In one embodiment, for example, the groove disposed to be spaced apart from the first groove BR1 with the dam part DMP therebetween may be provided, but is not limited thereto.

FIGS. 7A to 7D are enlarged views illustrating an area of the display panel according to an embodiment of the invention. FIGS. 7A to 7D illustrates embodiments with respect to an area corresponding to an area TT' of FIG. 5C. The same reference numerals are used to indicate the same components as that of FIGS. 1 to 5C, and any repetitive detailed descriptions will be omitted.

Figure 7A:
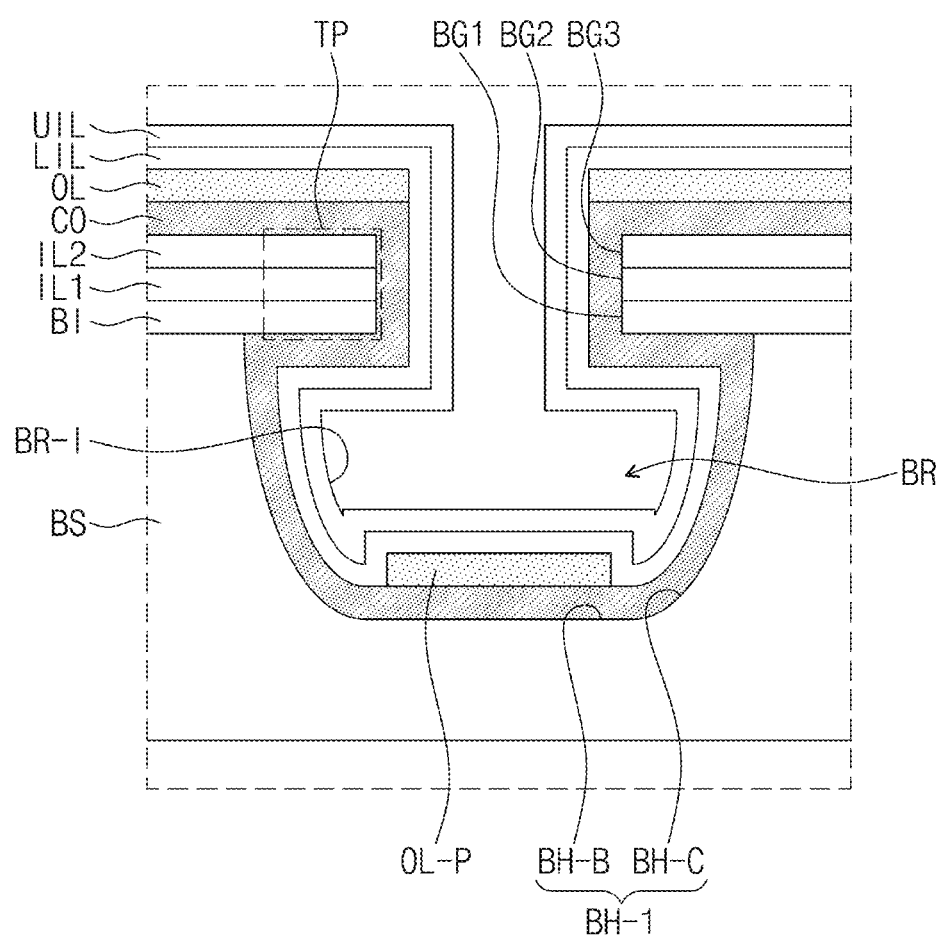
FIGS. 7A to 7D are enlarged views illustrating an area of the display panel according to embodiments of the invention.

Referring to FIG. 7A, in an embodiment, the base substrate BS may include a recess part BH which overlaps the hole area PA (see FIG. 5B) and from which at least a portion of the base substrate BS-1 is recessed. In such an embodiment, the recess part BH includes a bottom part BH-B and a side part BH-C. The bottom part BH-B and the side part BH-C may be connected to each other to define an inner space of the recess part BH. The side part BH-C may have a curved surface that is irregularly changed in a thickness direction thereof. In such an embodiment the shape of the side part BH-C may be the under-cut shape that is defined due to a difference in absorption of an etching material that is permeated in the thickness direction of the base substrate BS-1 to remove the insulation layers BI, IL1, and IL2.

The openings BG1, BG2, and BG3 of the insulation layers BI, IL1, and IL2 overlapping the recess part BH contacts the cover inorganic layer CO.

Figure 7B:
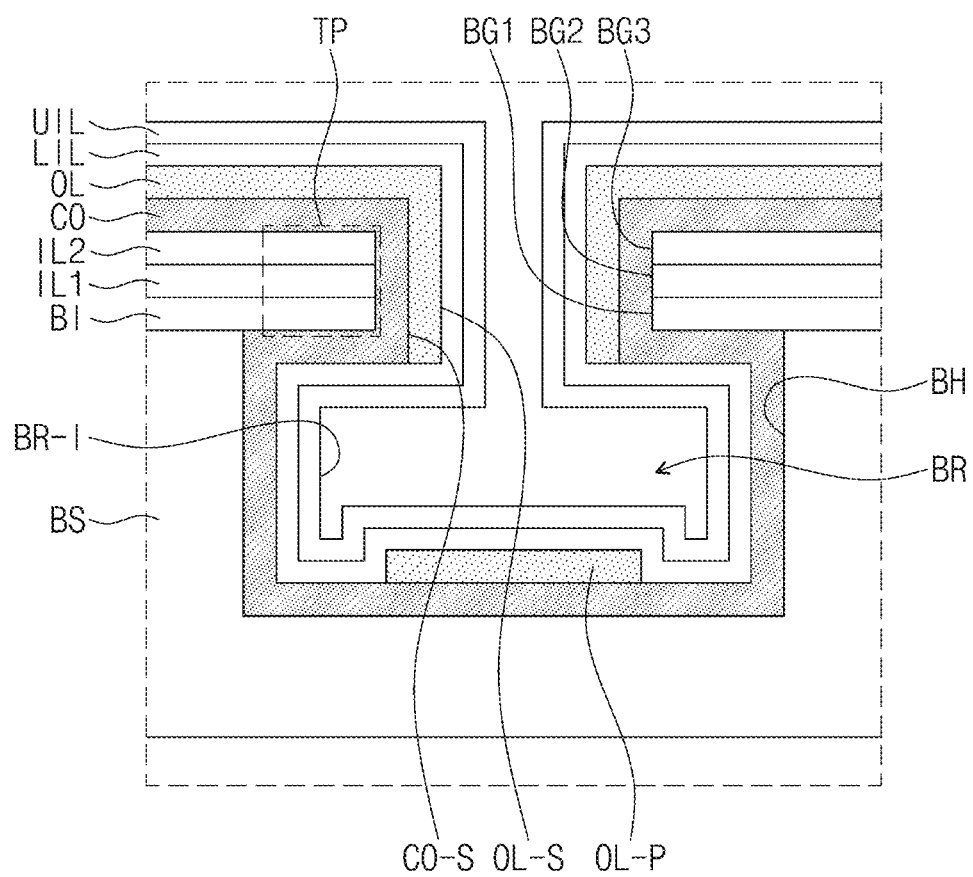

Referring to FIG. 7B, in an alternative embodiment, the charge control layer OL may overlap a portion CO-S of the cover inorganic layer CO covering the tip part TP. In one embodiment, for example, a portion of OL-S of the charge control layer OL may be disposed to cover the portion CO-S of the cover inorganic layer CO covering the inner surface of the openings BG1, BG2, and BG3 of the insulation layers BI, IL1, and IL2. In such an embodiment, the portion CO-S of the cover inorganic layer CO covering the openings BG1, BG2, and BG3 due to a process error covers the portion OL-S of the charge control layer OL. However, the embodiment of the invention is not limited thereto. Alternative, the charge control layer OL may extend to cover at least a portion of the cover inorganic layer CO covering the rear (or lower) surface of the barrier layer BI defined as the tip part TP.

According to an embodiment of the invention, the charge control layer OL covering the tip part TP is disposed to be spaced apart from the additional pattern part OL-P. Thus, the additional pattern part OL-P may be disconnected to the charge control layer OL. The additional pattern part OL-P may be connected to the charge control layer OL to block the path of the moisture and oxygen introduced from the module hole MH.

Figure 7C:
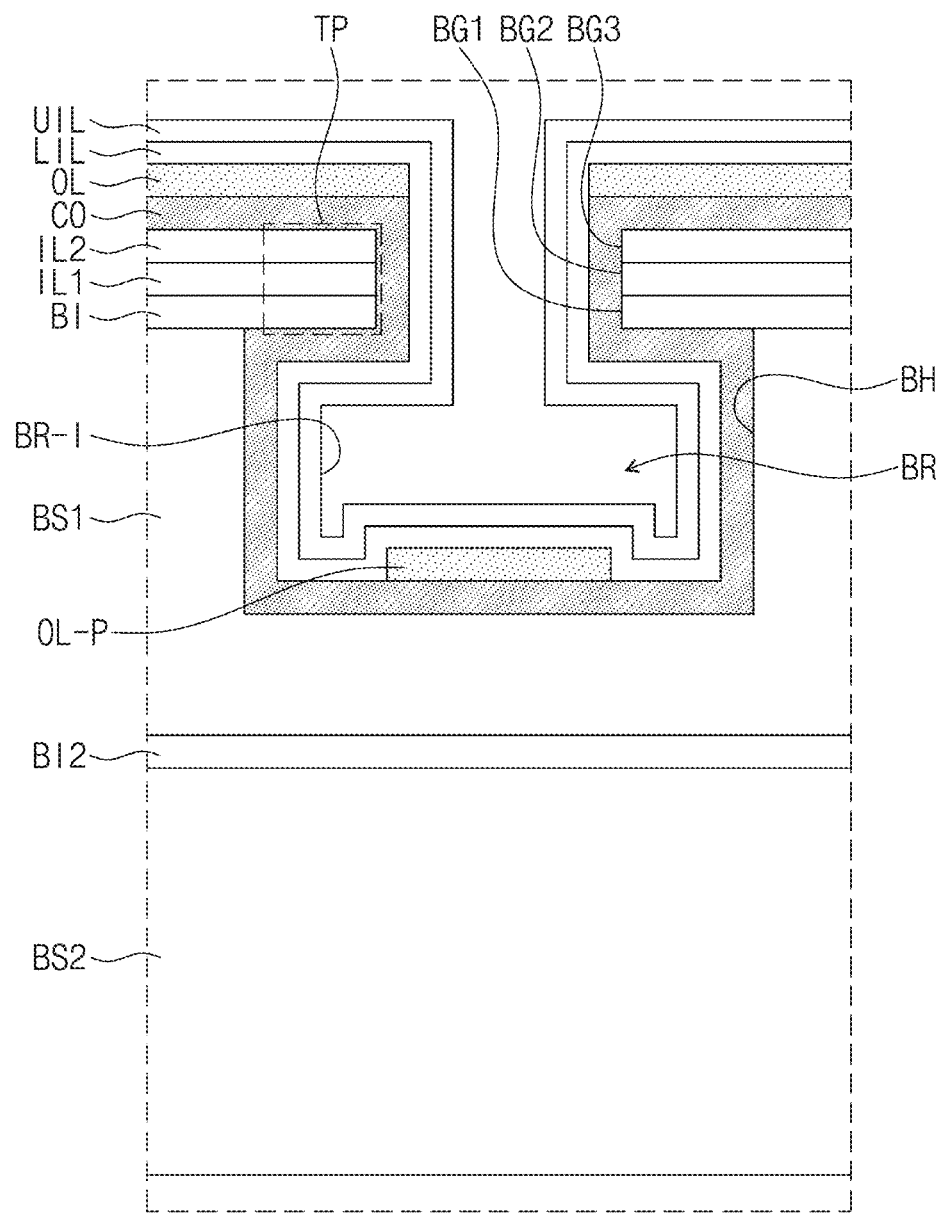

Referring to FIG. 7C, in another alternative embodiment, the display panel DP (see FIG. 5B) may further include a first base substrate BS1, a first barrier layer BI1, a second base substrate BS2, and a second barrier layer BI2.

A rear surface of the second base substrate BS2 may be defined as a rear surface of the display panel DP. The second barrier layer BI2 is disposed on the base substrate BS2. The first base substrate BS1 is disposed on the second barrier layer BI2. The first barrier layer BI1 is disposed on the first base substrate BS1.

Each of the base substrates BS1 and BS2 may include at least one of polyimide ("PI"), polyethylene naphthalate, polyethylene terephthalate, polyarylate, polycarbonate, polyetherimide, and polyethersulfone.

Each of the barrier layers BI1 and BI2 may be an insulation layer including an inorganic material. In one embodiment, for example, the barrier layer BI may include at least one of aluminum oxide ($AlO_x$), titanium oxide ($TiO_x$), silicon oxide ($SiO_x$), silicon oxynitride ($SiO_xN_y$), zirconium oxide ($ZrO_x$), and hafnium oxide ($HfO_x$). The barrier layers BI1 and BI2 may effectively prevent foreign substances from being introduced from the outside.

The groove BR may be provided by recessing a portion of the 1 base substrate BS from the top surface of the 1 barrier layer BI and be covered by at least one of the cover inorganic layer CO, the first encapsulation inorganic layer LIL, or the second encapsulation inorganic layer UIL.

Figure 7D:
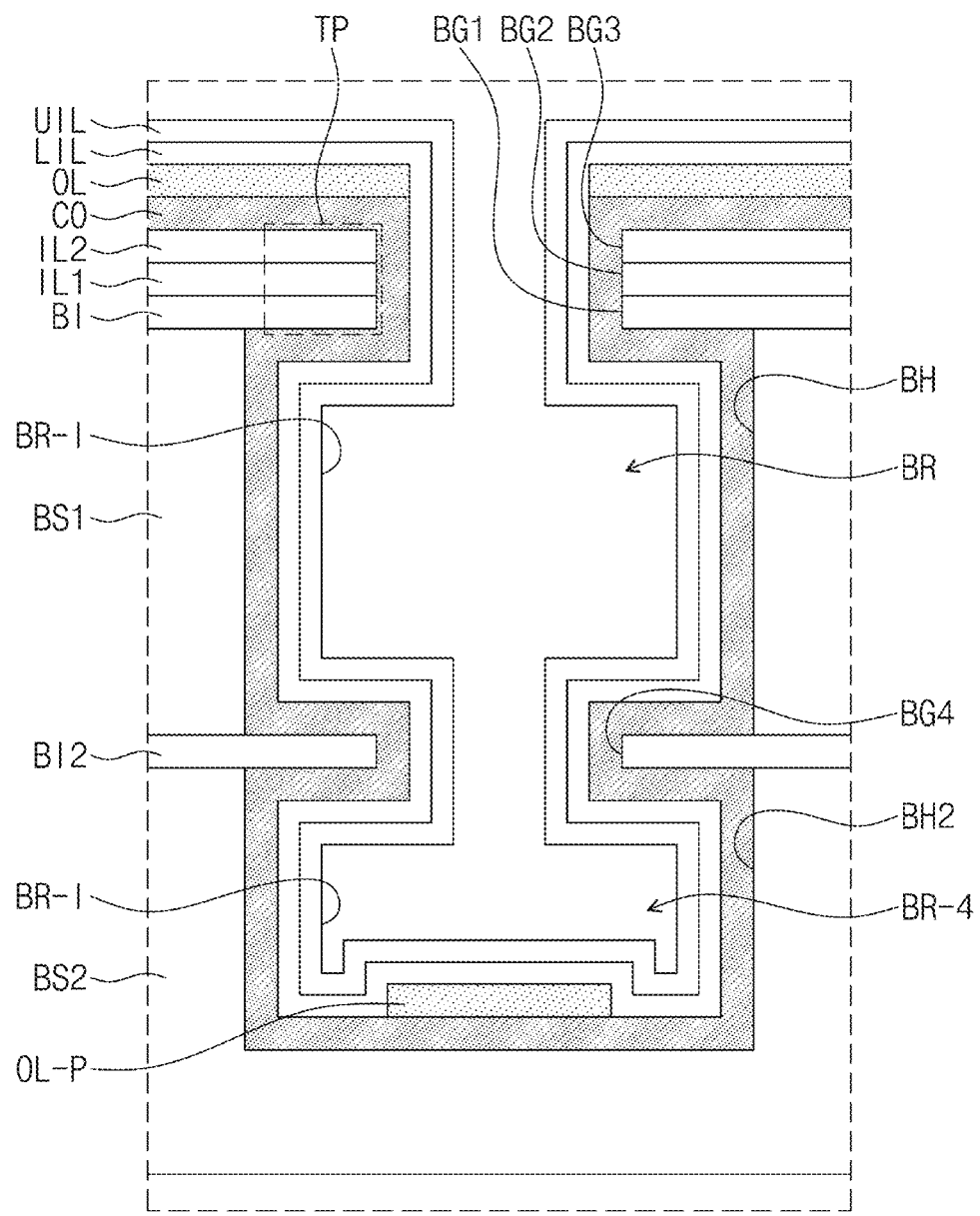

Referring to FIG. 7D, in another alternative embodiment, the display panel DP (see FIG. 5B) may further include a first base substrate BS1, a first barrier layer BI1, a second base substrate BS2, and a second barrier layer BI2. The a first base substrate BS1, the first barrier layer BI1, the second base substrate BS2, and the second barrier layer BI2 according to an embodiment may be the same as the base substrates and the barrier layers of FIG. 7C.

In such an embodiment, a first opening BG1 is defined through the first barrier layer BI1. A second opening BG2 is defined through which the first insulation layer IL1, and a third opening BG3 is defined through the second insulation layer IL2. The first base substrate BS1 may include a through-part BH1 through which the first base substrate BS1 passes.

In such an embodiment, a fourth opening BG4 is defined through the second barrier layer BI2, and the second base substrate BS2 includes a recess part BH2 in which at least a portion of the second base substrate BS2 is recessed.

The first opening BG1, the second opening BG2, the third opening BG3, the through-part BH1, the fourth opening BG4, and the recess part BH2 may overlap each other on the hole area PA.

At least one of the cover inorganic layer CO, the first encapsulation inorganic layer LIL, and the second encapsulation inorganic layer UIL (see FIG. 5B) may cover an inner surface of each of the first opening BG1, the second opening BG2, and the third opening BG3 to define the groove BR.

In such an embodiment, the base substrates provided as the plurality of layers and the barrier layers are penetrated/recessed to define the groove BR. Thus, the introduction path of the moisture and oxygen introduced from the module hole MH (see FIG. 5B) may extend to provide the display panel DP having the improved reliability.

In an embodiment of the display panel DP according to the invention, the recessed inner surface of the base substrate and the penetrated inner surfaces of the insulation layers may be covered by the cover inorganic layer CO to further effectively provide the rigid tip part TP (see FIG. 5B). Thus, the display panel DP having the improve impact resistance may be provided.

Figure 8A:
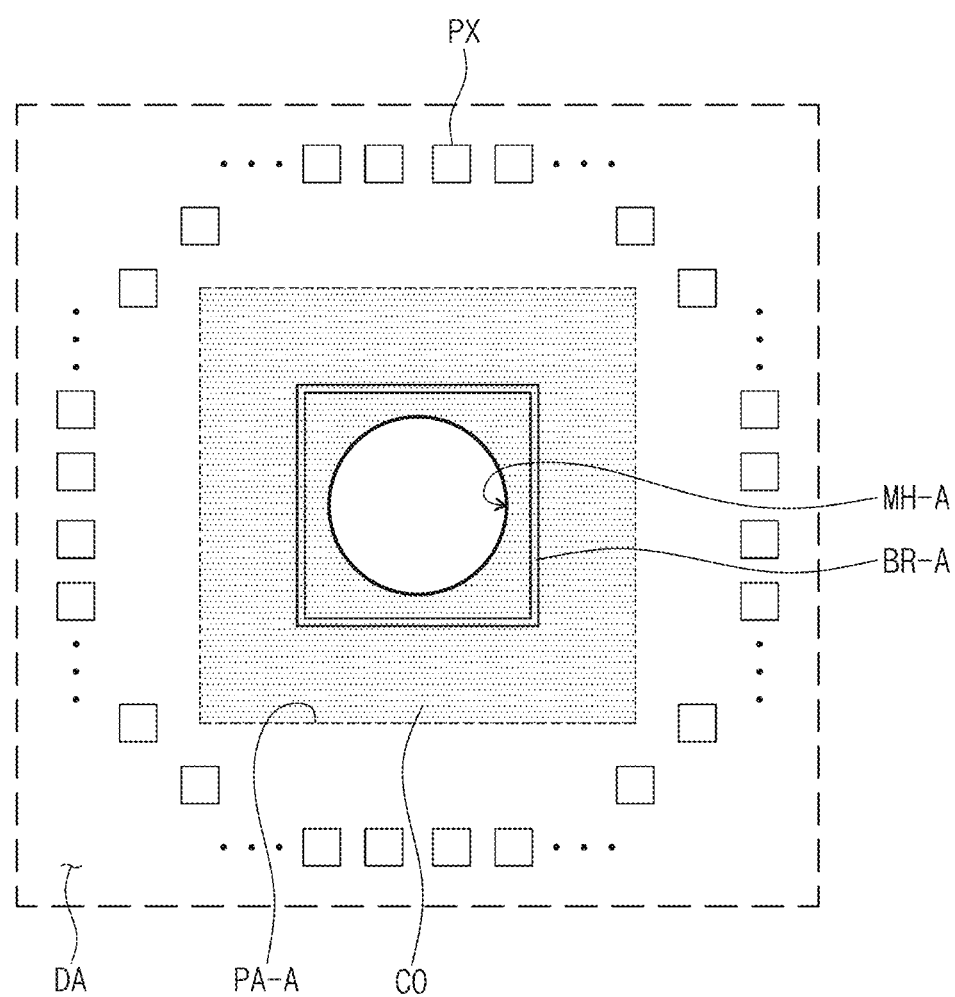
FIGS. 8A and 8B are enlarged view illustrating an area of the display panel according to embodiments of the invention.
Figure 8B:
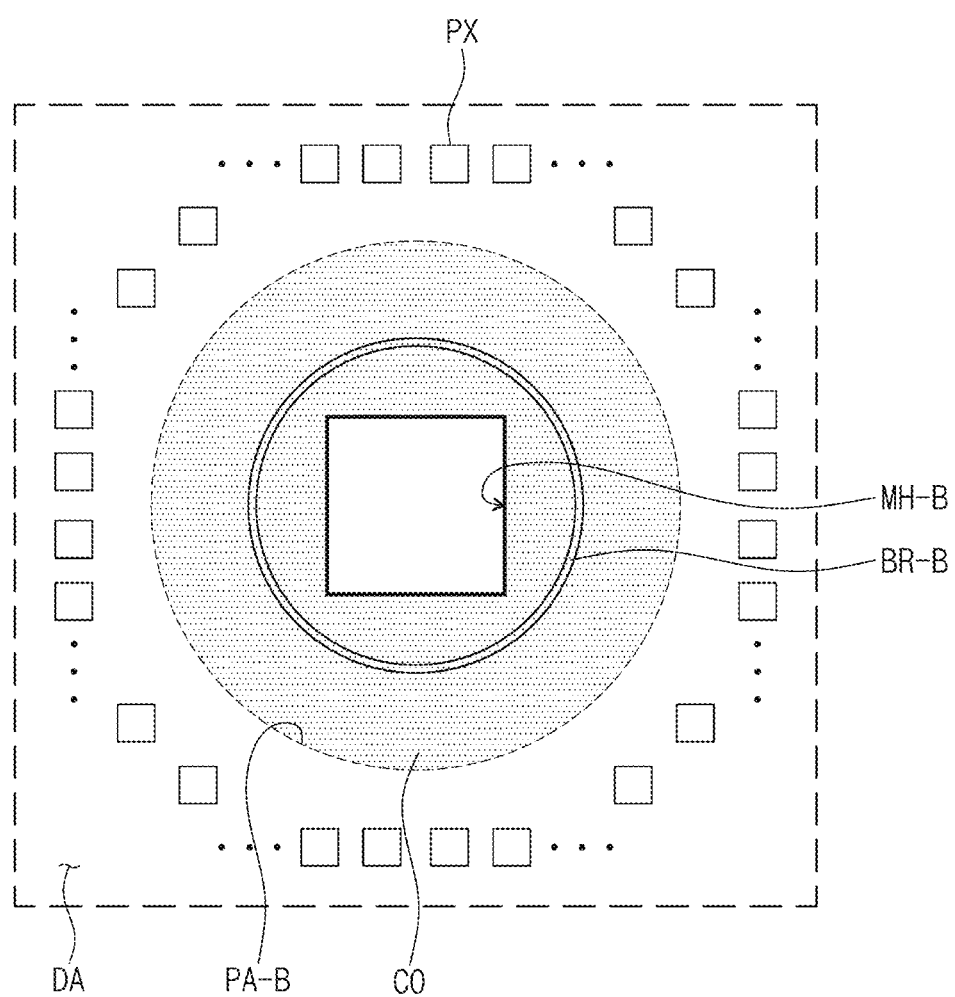

FIGS. 8A and 8B are enlarged view illustrating an area of the display panel according to embodiments of the invention. The same reference numerals are used to indicate the same components as that of FIGS. 1 to 5C, and any repetitive detailed descriptions will be omitted.

Referring to FIG. 8A, in an embodiment, a module hole HM-A and a groove BR-A may have shapes different from each other when viewed from a plan view in the third direction DR3. In one embodiment, for example, the module hole MH-A may have a circular shape. The groove BR-A may have a closed line shape surrounding the module hole MH-A. The closed line shape of the groove BR-A may have a rectangular shape. A hole area PA-A surrounding the groove BR-A may have a rectangular shape when viewed from a plan view in the third direction DR3.

According to an embodiment, since the module hole MH-A and the groove BR-A have the different shapes from each other when viewed from a plan view in the third direction DR3, the introduction path of the moisture and oxygen introduced from the module hole MH-A may be away from the module hole MH-A to improve the reliability of the display panel DP (see FIG. 5B).

Referring to FIG. 8B, in an alternative embodiment, a module hole HM-B and a groove BR-B may have shapes different from each other when viewed from a plan view in the third direction DR3. In one embodiment, for example, the module hole MH-B may have a rectangular shape. The groove BR-B may have a closed line shape surrounding the module hole MH-B. The closed line shape of the groove BR-B may have a circular shape. A hole area PA-B surrounding the groove BR-B may have a circular shape when viewed from a plan view in the third direction DR3.

However, the embodiment of the invention is not limited thereto. In such an embodiment, the shapes of the module hole HM-B and a groove BR-B may be variously modified as long as the hole areas PA-A and PA-B, the module holes MH-A and MH-B, and the grooves BR-A and BR-B have different shapes from each other when viewed from a plan view in the third direction DR3.

The module hole MH-B and the groove BR-B may have the shape similar to each other when viewed from a plan view in the third direction DR3 to reduce a region of a space between the module hole MH-B and the groove BR-B. Thus, the region occupied by the hole area PA provided within the display area DA (see FIG. 2) may be reduced to deteriorate an effect of the hole area PA on the display area DA.

In FIGS. 8A and 8B, an area on which the cover inorganic layer CO is disposed is shaded. Although an end of the cover inorganic layer CO overlaps a boundary between the display area DA and the hole area PA when viewed from a plan view in the third direction DR3 in FIGS. 8A and 8B, the embodiment of the invention is not limited thereto. For example, the embodiment of the invention is not limited thereto as long as the area overlaps the groove BR within the hole area PA.

According to an embodiment of the invention, since the cover inorganic layer CO is disposed to overlap only the hole area PA, the cover inorganic layer CO may be spaced apart from the organic light emitting element ED.

FIGS. 9A to 9F are cross-sectional views illustrating a method for manufacturing a display panel according to an embodiment of the invention. The same reference numerals are used to indicate the same components as that of FIGS. 1 to 5C, and any repetitive detailed descriptions thereof will be omitted. Hereinafter, an embodiment of a method for manufacturing a display panel according to the invention will be described with reference to FIGS. 9A to 9F.

Figure 9A:
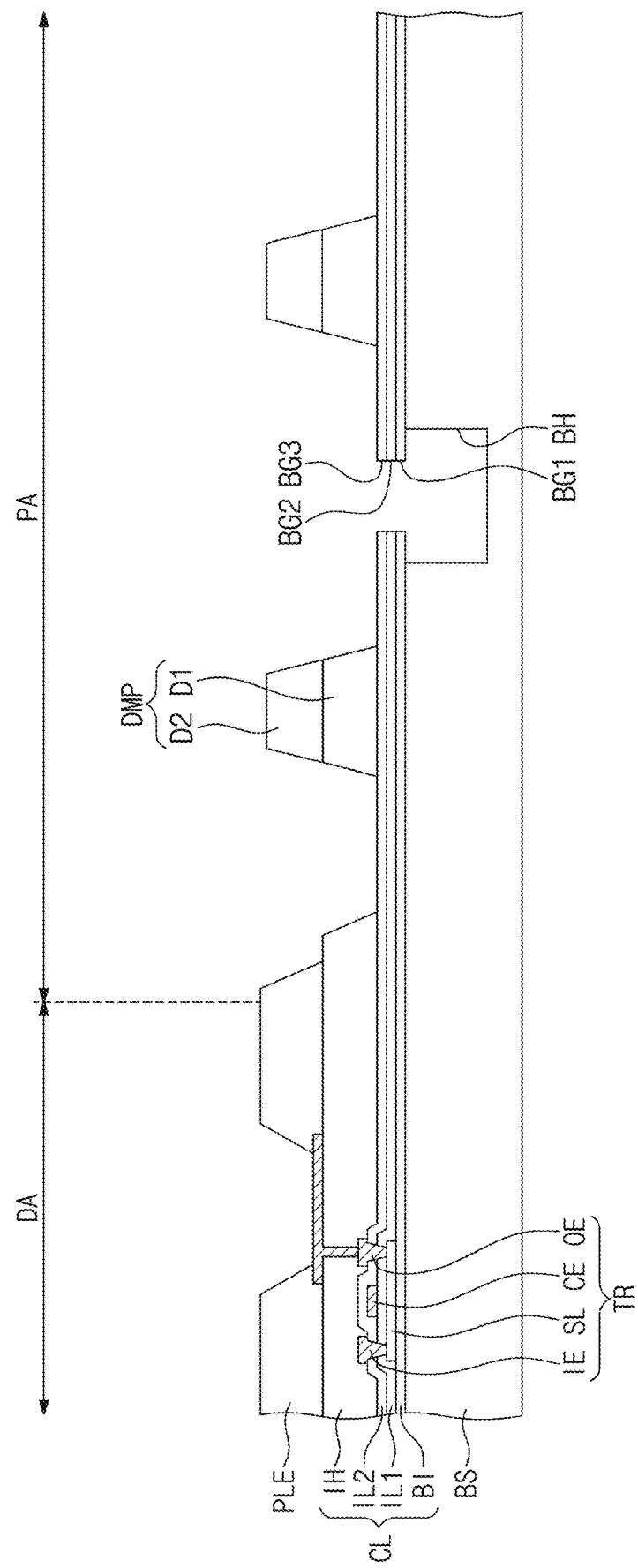

Referring to FIG. 9A, a barrier layer BI is provided or formed on a base substrate BS. A transistor TR is provided or formed on a barrier layer BI overlapping a display area DA. Electrodes SL, CL, IE, and OE of the transistor TR may be formed by patterning a conductive material. The electrodes SL, CL, IE, and OE may be spaced apart from a plurality of insulation layers IL1, IL2, and IH, and a semiconductor pattern SL, an input electrode IE, and an output electrode OE may be connected to each other through contact holes defined or formed in the insulation layers IL1 and IL2.

The first electrode E1 is provided or formed on the third insulation layer IH. The first electrode E1 may be formed by patterning a conductive material. The first electrode E1 may be connected to the output electrode OE through a contact hole defined or formed in the third insulation layer IH.

A pixel defining layer PLE including an organic material is provided or formed on the third insulation layer IH. An opening through which at least a portion of the first electrode E1 is exposed may be formed or defined in the pixel defining layer PLE.

A dam part DMP may be provided or formed on a second insulation layer IL2 overlapping a hole area PA. The dam part DMP may have a multilayered structure constituted by a first dam part D1 and a second dam part D2 disposed on the first dam part D1. The dam part DMP may include an organic material. In one embodiment, for example, the first dam part D1 may include a same material as the third insulation layer IH, and the second dam part D2 may include a same material as the pixel defining layer PLE.

Openings BG1, BG2, and BG3 passing through the barrier layer BI, the first insulation layer IL1, and the second insulation layer IL2 may be formed in portions of the barrier layer BI, the first insulation layer IL1, and the second insulation layer IL2 overlapping the hole area PA, respectively. A portion of the base substrate BS overlapping the hole area PA may be recessed to form a recess part BH. Each of the openings BG1, BG2, and BG3 and the recess part BH may have a under-cut shape due to a difference in etching rate depending on an etching material.

Figure 9B:
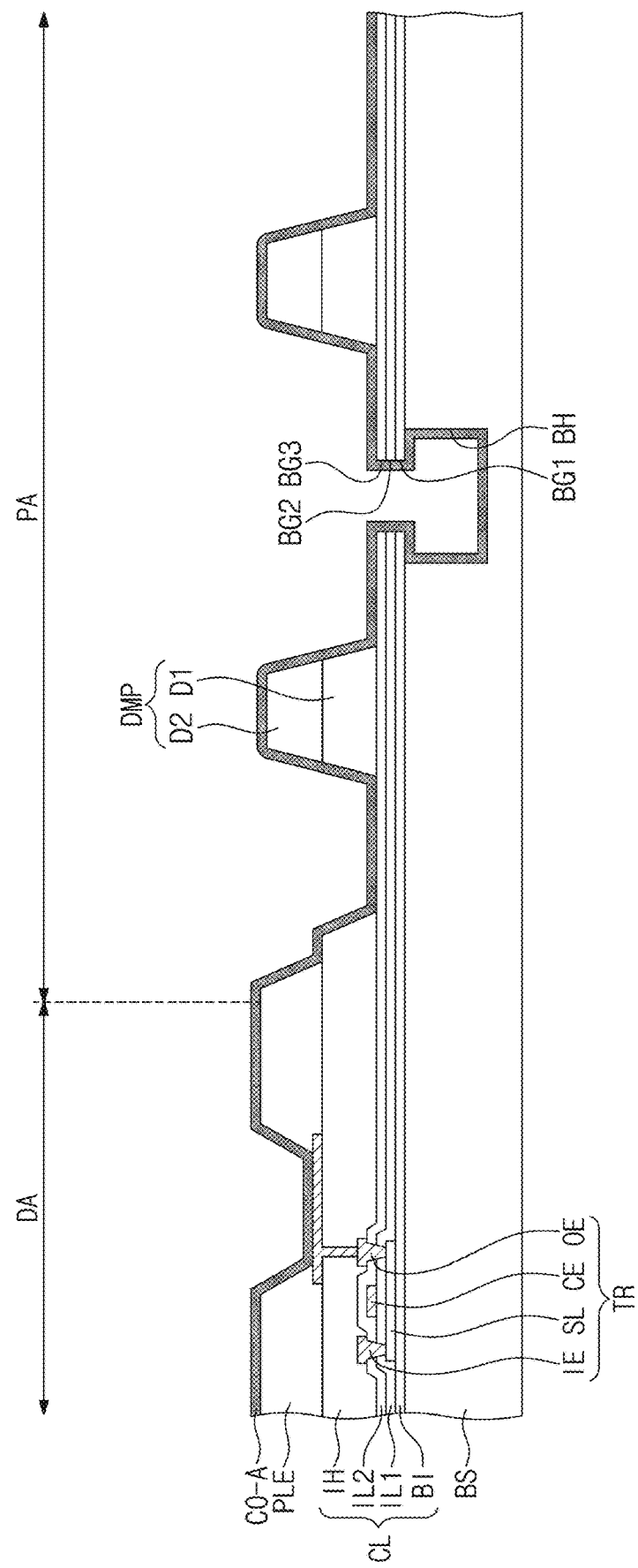

Thereafter, referring to FIGS. 9B and 9C, an initial cover inorganic layer CO-A may be provided or formed on an entire surface of the base substrate BS. The initial cover inorganic layer CO-A may include an inorganic material. The initial cover inorganic layer CO-A may be formed to contact inner surfaces of the recess part BH and the openings BG1, BG2, and BG3. Thereafter, a portion of the initial cover inorganic layer CO-A is removed or etched to form a cover inorganic layer CO. The cover inorganic layer CO may be formed to overlap the hole area PA. Thus, constituents formed on the display area DA may be exposed by the cover inorganic layer CO.

Figure 9D:
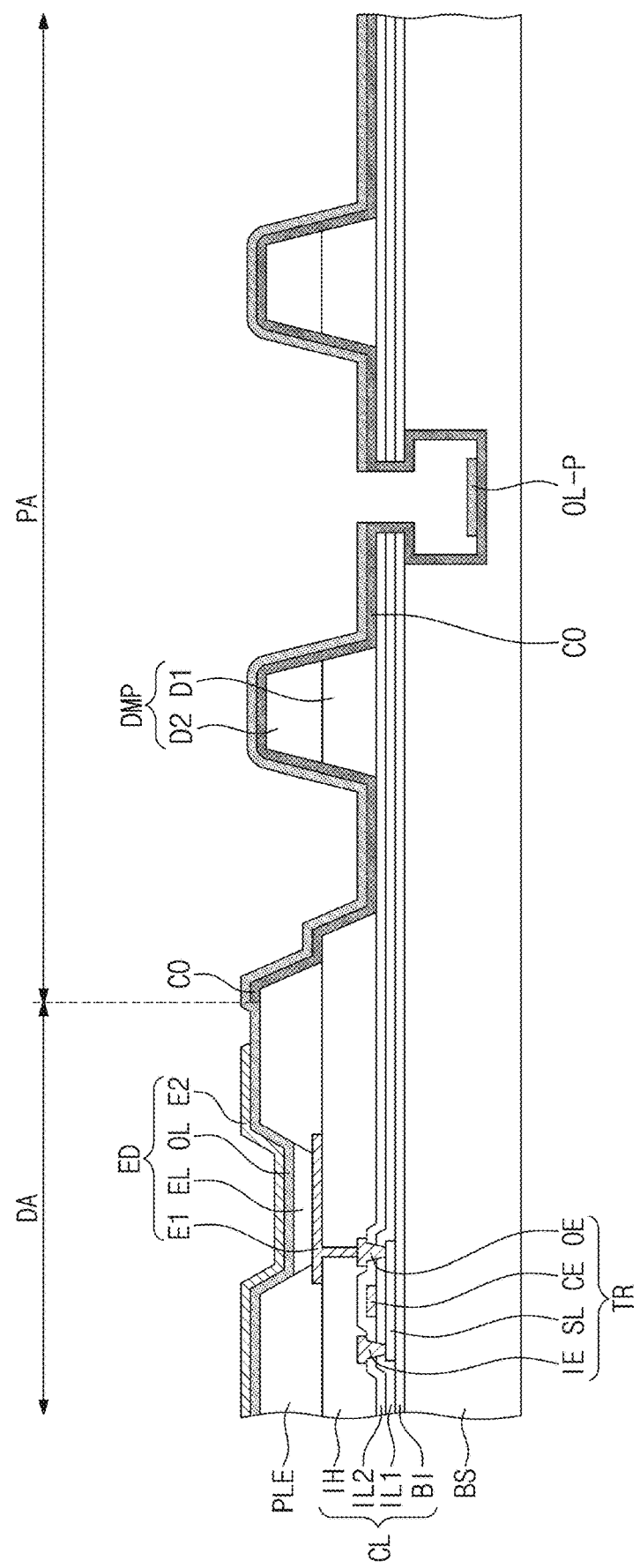

Thereafter, referring to FIG. 9D, a light emitting layer EL, a charge control layer OL, and a second electrode E2 are provided or formed on the pixel defining layer PLE through a deposition process to form an organic light emitting element ED. In an embodiment, each of the light emitting layer EL and the charge control layer may be defined as an organic layer including an organic material. The organic layer and/or the second electrode E2 may extend to the hole area and be formed on a front surface of the base substrate BS. Although the second electrode E2 is formed on only the display area DA in FIG. 9D, the embodiment of the invention is not limited thereto. Alternatively, the second electrode E2 may be further formed on the front surface of the base substrate BS.

Figure 9E:
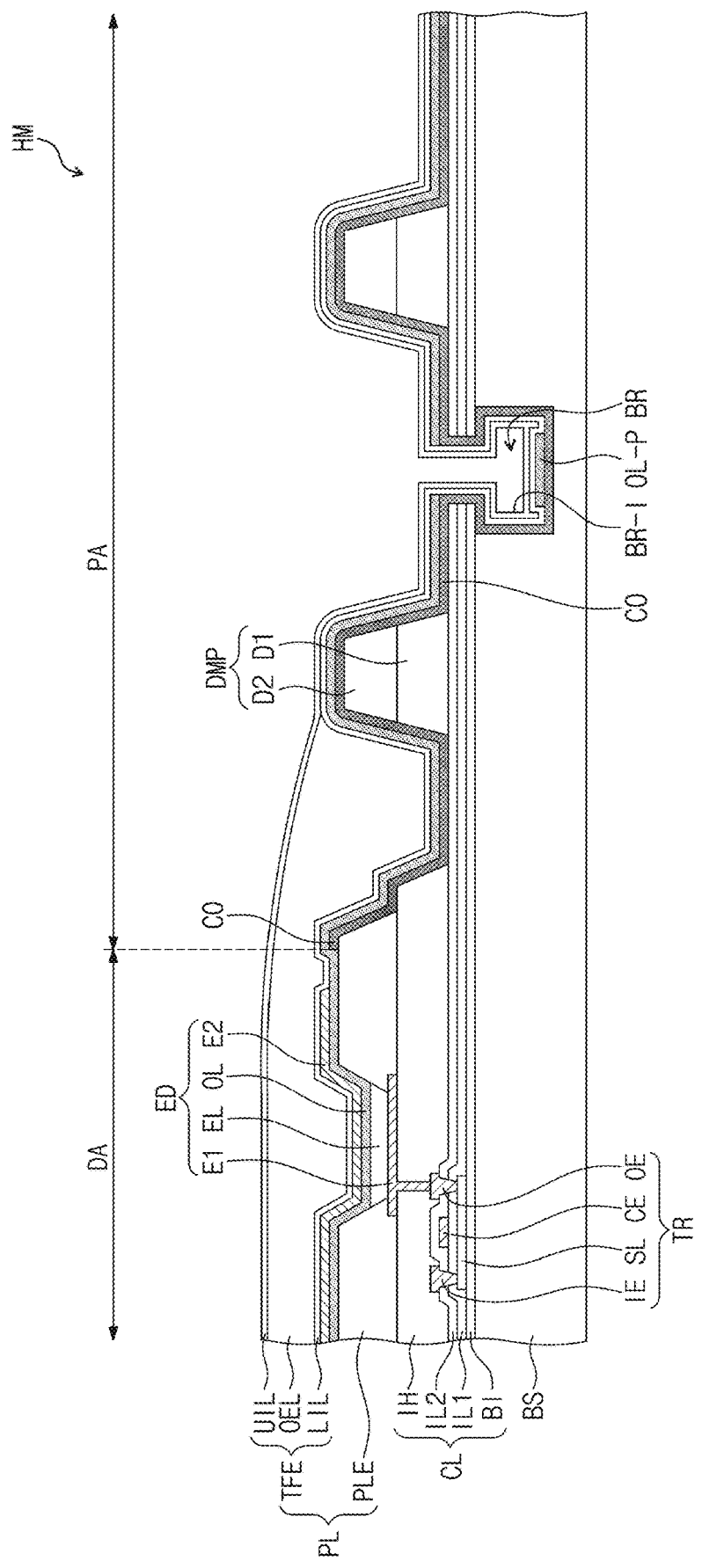

Thereafter, referring to FIG. 9E, a first encapsulation inorganic layer LIL including an inorganic material may be provided or formed on the display area DA and the hole area PA. Thereafter, an encapsulation organic layer OEL including an organic material is provided or formed on the first encapsulation inorganic layer LIL.

The dam part DMP may be defined as an area into which a liquid organic material is spread in a process of forming the encapsulation organic layer OEL. The encapsulation organic layer OEL may be manufactured in an inkjet manner in which the liquid organic material is applied to the first encapsulation inorganic layer LIL. Here, the dam part DMP may set a boundary of an area to which the liquid organic material applied and prevent the liquid organic material from overflowing to an outer side thereof.

Thereafter, a second encapsulation inorganic layer UIL including an inorganic material may be provided or formed on the display area DA and the hole area PA. The first encapsulation inorganic layer LIL and the second encapsulation inorganic layer UIL may be formed to contact each other on the hole area PA. The first encapsulation inorganic layer LIL may be formed to cover an entire surface of the cover inorganic layer CO.

Figure 9F:
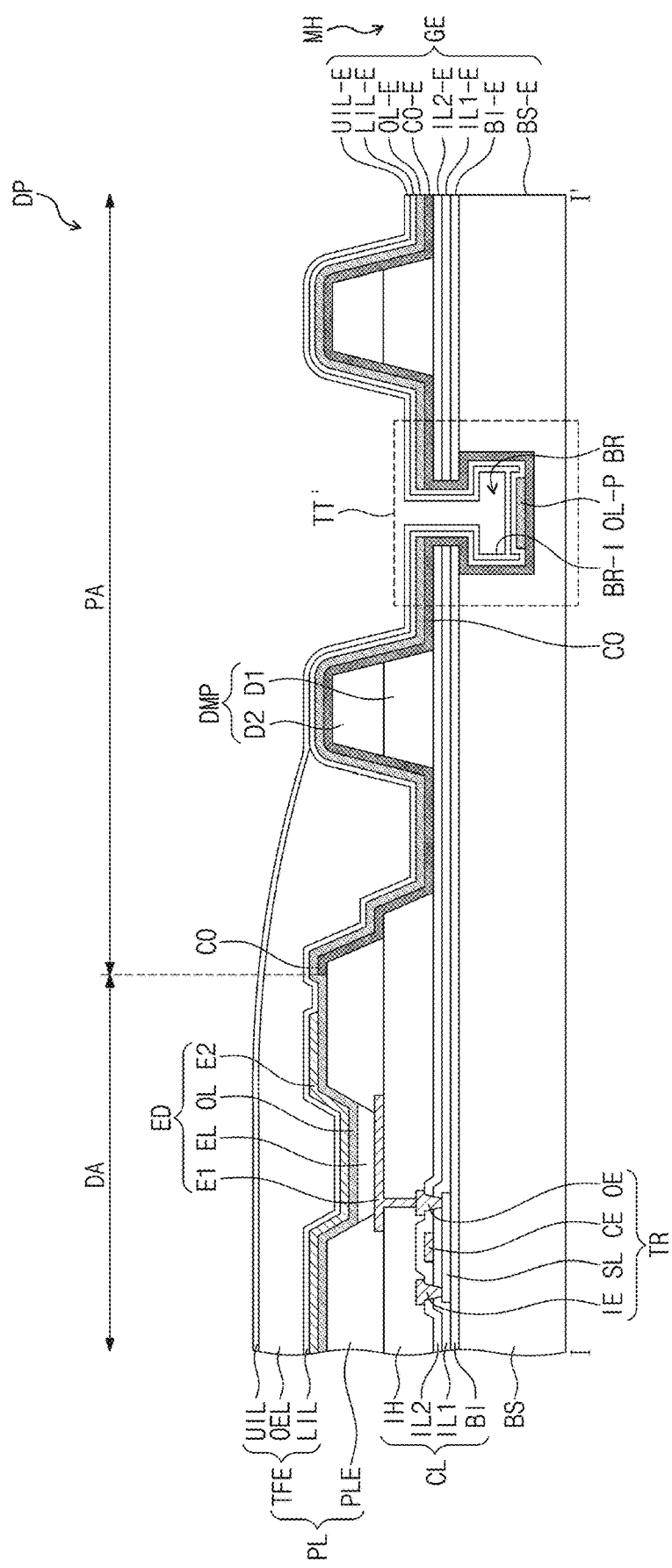

Thereafter, referring to FIG. 9F, a module hole HM may be formed in an area of the display area DA overlapping the hole area PA. The module hole MH may have an inner surface GE formed by aligning an end BS-E of the base substrate, an end of the barrier layer BI-E, an end of the first insulation layer IL1-E, an end of the second insulation layer IL2-E, an end of the charge control layer OL-E, an end of the cover inorganic layer CO-E, an end of the first encapsulation inorganic layer LIL-E, and an end of the second encapsulation inorganic layer UIL-E.

According to an embodiment of the invention, the separate cover inorganic layer CO covering the tip part TP may be provided so that the rigid tip part TP is capable of being design. Thus, the display panel DP having the improve impact resistance may be provided.

According to embodiments of the invention, the display panel that does not interfere with the electronic module may be provided. Thus, even though the electronic module is provided, the display device having the narrow bezel area may be provided.

In such embodiments, the element may be effectively prevented from being damaged by the moisture or oxygen introduced from an outside. Thus, the display device may have improved reliability in process and use.

Also, according to embodiments of the invention, the inorganic layer additionally disposed on the tip part of the groove may be provided to allow the electronic device to have improved impact resistance.

While the invention have been described with reference to exemplary embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. A display panel comprising:
   a base substrate divided into a hole area comprising a recess part in which at least a portion of the base substrate is recessed, a display area surrounding the hole area, and a non-display area adjacent to the display area;
   a circuit layer disposed on the base substrate, wherein the circuit layer comprises a transistor overlapping the display area and a plurality of insulation layers, an opening is defined in each of the insulation layers, and the opening overlaps the hole area;
   an element layer overlapping the display area and comprising an organic light emitting element connected to the transistor;
   an encapsulation layer disposed on the element layer and comprising a first encapsulation inorganic layer, a second encapsulation inorganic layer, and an encapsulation organic layer disposed between the first encapsulation inorganic layer and the second encapsulation inorganic layer; and
   a cover inorganic layer overlapping the hole area and disposed between the first encapsulation inorganic layer and the insulation layer of the insulation layers, which is the closest to the first encapsulation inorganic layer;
   wherein a module hole is defined through the base substrate, at least a portion of the insulation layers, the cover inorganic layer, the first encapsulation inorganic layer and the second encapsulation inorganic layer, wherein the module hole overlaps the hole area and is spaced apart from the opening,
   wherein a first groove is defined by portions of the cover inorganic layer, the first encapsulation inorganic layer and the second encapsulation inorganic layer which cover an inner surface of the opening of each of the insulation layers and an inner surface of the recess part, and
   wherein the cover inorganic layer contacts the inner surface of the opening of each of the insulation layers and the inner surface of the recess part.

2. The display panel of claim 1, wherein the cover inorganic layer has a thickness in a range of 500 Å to 20,000 Å.

3. The display panel of claim 1, wherein the cover inorganic layer does not contact the display area when viewed from a plan view in a thickness direction of the base substrate.

4. The display panel of claim 1, wherein the cover inorganic layer comprises at least one of silicon oxide ($SiO_x$), silicon nitride ($SiN_x$), and silicon oxynitride ($SiO_xN_y$).

5. The display panel of claim 1, further comprising:
   a dam part overlapping the hole area,
   wherein the dam part comprises a same material as one of the insulation layers.

6. The display panel of claim 5, wherein
   a second groove is defined by a portion of the base substrate which is recessed from a top surface of the insulation layers,
   the second groove is spaced apart from the first groove with the dam part therebetween and the second groove is covered by the cover inorganic layer and the first encapsulation inorganic layer, the second groove defines an inner space, and
the inner space is filled with the encapsulation organic layer.

7. The display panel of claim 1, wherein
the organic light emitting element comprises a first electrode connected to the transistor, a second electrode spaced apart from the first electrode, and an organic layer disposed between the first electrode and the second electrode, and
at least one of the organic layer and the second electrode extends from the display area to the module hole.

8. The display panel of claim 7, wherein an inner surface of the module hole is defined by exposed ends of the base substrate, at least a portion of the insulation layers, the organic layer, the cover inorganic layer, the first encapsulation inorganic layer and the second encapsulation inorganic layer.

9. The display panel of claim 7, further comprising:
an additional pattern part overlapping the first groove and disposed between the cover inorganic layer and the first encapsulation inorganic layer,
wherein the additional pattern part comprises a same material as at least one of the organic layer and the second electrode.

10. The display panel of claim 9, wherein at least one of the organic layer and the second electrode covers a side surface defining the opening of each of the insulation layers.

11. The display panel of claim 9, wherein the additional pattern part is spaced apart from the organic layer and the second electrode.

12. The display panel of claim 11, wherein
the insulation layers, which overlap the recess part when viewed from a plan view in a thickness direction of the base substrate, of the insulation layers define tip parts, and
the tip parts are covered by the cover inorganic layer.

13. The display panel of claim 1, wherein the first groove has a closed line shape surrounding the module hole when viewed from a plan view in a thickness direction of the base substrate.

14. The display panel of claim 1, wherein
the recess part comprises a bottom part and a side part connected to the bottom part, and
the side part has a curved surface which is irregularly changed in a thickness direction of the base substrate.

15. The display panel of claim 1, further comprising:
an additional base substrate disposed below the base substrate and comprising an additional recess part overlapping the recess part; and
a barrier layer disposed between the base substrate and the additional base substrate, wherein an additional opening overlapping the additional recess part is defined through the barrier layer,
wherein the cover inorganic layer contacts an inner surface of each of the openings, the recess part, the additional opening, and the additional recess part.

16. An electronic device comprising:
a base substrate divided into a hole area comprising a recess part in which at least a portion of the base substrate is recessed, a display area surrounding the hole area, and a non-display area adjacent to the display area;
insulation layers disposed on the base substrate, wherein an opening is defined through at least a portion of the insulation layers to overlap the hole area;
an organic light emitting element overlapping the display area and disposed on the insulation layers; and
a plurality of inorganic layers disposed on the insulation layers,
wherein a module hole is defined through the base substrate, at least portion of the insulation layers, and the inorganic layers to overlap the hole area; and
a groove is defined by a portion of the inorganic layers which covers an inner surface of the recess part and an inner surface of the opening,
wherein the inorganic, which is the closest to the base substrate, of the inorganic layers contacts the inner surface of the opening and the inner surface of the recess part.

17. The electronic device of claim 16, wherein an inorganic layer, which is the closest to the base substrate and contacting the inner surface of the recess part, among the inorganic layers, does not overlap the display area when viewed from a plan view in a thickness direction of the base substrate.

18. The electronic device of claim 16, further comprising:
an encapsulation layer which covers the organic light emitting element, wherein the encapsulation layer comprises an encapsulation organic layer and a plurality of encapsulation inorganic layers which seals the encapsulation organic layer,
wherein at least one of the inorganic layers extends from the encapsulation inorganic layers.

19. The electronic device of claim 16, wherein
tip parts are defined by a portion of the insulation layers overlapping the recess part when viewed from a plan view in a thickness direction of the base substrate, and
the tip parts are covered by the inorganic layer, which contacts the inner surface of the recess part, of the inorganic layers.

20. The electronic device of claim 16, further comprising:
an electronic module overlapping the module hole and disposed below the base substrate,
wherein the electronic module comprises at least one of an audio output module, a light emitting module, a light receiving module and a camera module.

21. A display panel comprising:
a base substrate divided into a hole area comprising a recess part in which at least a portion of the base substrate is recessed, a display area surrounding the hole area, and a non-display area adjacent to the display area;
a plurality of insulation layers disposed on the base substrate, wherein an opening is defined through each of the insulation layers, and the opening overlaps the hole area;
an organic light emitting element overlapping the display area and disposed on the insulation layers, and comprising a first electrode, a second electrode spaced apart from the first electrode and an organic layer disposed between the first electrode and the second electrode;
an encapsulation layer disposed on the organic light emitting element and comprising a first encapsulation inorganic layer, a second encapsulation inorganic layer, and an encapsulation organic layer disposed between the first encapsulation inorganic layer and the second encapsulation inorganic layer; and
a cover inorganic layer overlapping the hole area and disposed between the first encapsulation inorganic layer and an insulation layer of the insulation layers, which is the closest to the first encapsulation inorganic layer,
wherein a module hole is defined through the base substrate, at least a portion of the insulation layers, and the cover inorganic layer to overlap the hole area, wherein the module hole is spaced apart from the opening of each of the insulation layers;

wherein a groove is defined by a portion of the cover inorganic layer which covers an inner surface of the opening of each of insulation layers and an inner surface of the recess part, wherein an additional pattern part is disposed between the cover inorganic layer and the first encapsulation inorganic layer to overlap the groove, and wherein the additional pattern part is spaced apart from the organic layer and the second electrode.

22. The display panel of claim 21, wherein the additional pattern part comprises a same material as at least one of the organic layer and the second electrode.

* * * * *